United States Patent
Sun et al.

(10) Patent No.: US 7,671,295 B2
(45) Date of Patent: *Mar. 2, 2010

(54) PROCESSING A MEMORY LINK WITH A SET OF AT LEAST TWO LASER PULSES

(75) Inventors: Yunlong Sun, Beaverton, OR (US); Edward J. Swenson, Portland, OR (US); Richard S. Harris, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/322,347

(22) Filed: Dec. 17, 2002

(65) Prior Publication Data

US 2003/0151053 A1 Aug. 14, 2003

Related U.S. Application Data

(63) Continuation-in-part of application No. 09/757,418, filed on Jan. 9, 2001, now Pat. No. 6,574,250.

(60) Provisional application No. 60/341,744, filed on Dec. 17, 2001, provisional application No. 60/223,533, filed on Aug. 4, 2000, provisional application No. 60/175,337, filed on Jan. 10, 2000.

(51) Int. Cl.
- B23K 26/02 (2006.01)
- B23K 26/08 (2006.01)
- H01L 21/77 (2006.01)

(52) U.S. Cl. ............... 219/121.6; 219/121.67; 219/121.68; 219/121.61; 219/121.62; 219/121.69; 438/132; 438/940

(58) Field of Classification Search . 219/121.6–121.62, 219/121.67–121.69; 438/132, 948, 130, 438/940; 257/E23.15, E21.596; 372/29.021, 372/10, 25, 29.023, 31

See application file for complete search history.

(56) References Cited

U.S. PATENT DOCUMENTS 3,740,523 A  6/1973  Cohen ................. 219/121 LM (Continued)

FOREIGN PATENT DOCUMENTS

EP  0 367 507 A2  5/1990

(Continued)

OTHER PUBLICATIONS

Time-Bandwidth Products, *Integrated Nd YAG or Nd: YLF Picosecond Regenerative Amplifier System*, Feb. 2000.

(Continued)

*Primary Examiner*—Evan Pert
(74) *Attorney, Agent, or Firm*—Stoel Rives LLP

(57) ABSTRACT

A set (50) of laser pulses (52) is employed to sever a conductive link (22) in a memory or other IC chip. The duration of the set (50) is preferably shorter than 1,000 ns; and the pulse width of each laser pulse (52) within the set (50) is preferably within a range of about 0.1 ps to 30 ns. The set (50) can be treated as a single "pulse" by conventional laser positioning systems (62) to perform on-the-fly link removal without stopping whenever the laser system (60) fires a set (50) of laser pulses (52) at each link (22). Conventional IR wavelengths or their harmonics can be employed.

78 Claims, 7 Drawing Sheets

U.S. PATENT DOCUMENTS

| | | | |
|---|---|---|---|
| 3,806,829 A | 4/1974 | Duston et al. | 331/94.5 |
| 3,869,210 A | 3/1975 | Fletcher et al. | 356/106 LR |
| 4,044,222 A | 8/1977 | Kestenbaum | 219/121 LM |
| 4,114,018 A | 9/1978 | Von Allmen et al. | 219/121 LM |
| 4,397,527 A | 8/1983 | Geyer | 350/400 |
| 4,399,345 A | 8/1983 | Lapham et al. | 219/121 LJ |
| 4,410,237 A | 10/1983 | Veldkamp | 350/320 |
| 4,414,059 A | 11/1983 | Blum et al. | 156/659.1 |
| 4,432,613 A | 2/1984 | Ueda et al. | 350/358 |
| 4,467,172 A | 8/1984 | Ehrenwald et al. | 219/121 LH |
| 4,483,005 A | 11/1984 | Smart | 372/25 |
| 4,532,402 A | 7/1985 | Overbeck | 219/121 LU |
| 4,602,852 A | 7/1986 | Moroz | 350/358 |
| 4,646,308 A | 2/1987 | Kafka et al. | 372/25 |
| 4,742,522 A | 5/1988 | Linford | 372/2 |
| 4,780,177 A | 10/1988 | Wojnarowski et al. | 156/643 |
| 4,794,615 A | 12/1988 | Berger et al. | 372/69 |
| 4,826,785 A | 5/1989 | McClure et al. | 437/174 |
| 4,827,325 A | 5/1989 | Or-Bach et al. | 357/54 |
| 4,861,964 A | 8/1989 | Sinohara | 219/121.6 |
| 4,872,140 A | 10/1989 | Graham et al. | 365/96 |
| 4,878,222 A | 10/1989 | Lawrence | 372/48 |
| 4,914,663 A | 4/1990 | Basu et al. | 372/18 |
| 4,918,284 A | 4/1990 | Weisz | 219/121.78 |
| 4,932,031 A | 6/1990 | Alfano et al. | 372/41 |
| 4,935,801 A | 6/1990 | McClure et al. | 357/51 |
| 4,941,093 A | 7/1990 | Marshall et al. | 364/413.01 |
| 5,005,946 A | 4/1991 | Brandstetter | 350/162.12 |
| 5,021,362 A | 6/1991 | Chlipala | 437/173 |
| 5,034,951 A | 7/1991 | Edelstein et al. | 372/22 |
| 5,042,040 A | 8/1991 | Harvey et al. | 372/18 |
| 5,059,764 A | 10/1991 | Baer | 219/121.68 |
| 5,175,664 A | 12/1992 | Diels et al. | 361/213 |
| 5,197,074 A | 3/1993 | Emmons, Jr. et al. | 372/26 |
| 5,208,437 A | 5/1993 | Miyauchi et al. | 219/121.67 |
| 5,236,551 A | 8/1993 | Pan | 156/643 |
| 5,265,114 A | 11/1993 | Sun et al. | 372/69 |
| 5,268,911 A | 12/1993 | Young | 372/13 |
| 5,280,491 A | 1/1994 | Lai | 372/24 |
| 5,293,025 A | 3/1994 | Wang | 219/121.71 |
| 5,294,567 A | 3/1994 | Dorfman et al. | 437/187 |
| 5,300,756 A | 4/1994 | Cordingley | 219/121.69 |
| 5,310,989 A | 5/1994 | Russell et al. | 219/121.68 |
| 5,329,152 A | 7/1994 | Janai et al. | 257/529 |
| 5,361,275 A | 11/1994 | Opower | 372/108 |
| 5,374,590 A | 12/1994 | Batdorf et al. | 437/173 |
| 5,400,350 A | 3/1995 | Galvanauskas | 372/20 |
| 5,451,785 A | 9/1995 | Faris | 250/330 |
| 5,463,200 A | 10/1995 | James et al. | 219/121.68 |
| 5,473,624 A | 12/1995 | Sun | 372/69 |
| 5,475,527 A | 12/1995 | Hackel et al. | 359/334 |
| 5,494,781 A | 2/1996 | Ohtani et al. | 430/313 |
| 5,513,194 A | 4/1996 | Tamura et al. | 372/6 |
| 5,520,679 A | 5/1996 | Lin | 606/5 |
| 5,521,628 A | 5/1996 | Montgomery | 347/243 |
| 5,524,018 A | 6/1996 | Adachi | 372/98 |
| 5,539,764 A | 7/1996 | Shields et al. | 372/57 |
| 5,558,789 A | 9/1996 | Singh | 219/121.69 |
| 5,569,398 A | 10/1996 | Sun et al. | 219/121.68 |
| 5,586,138 A | 12/1996 | Yokoyama | 372/97 |
| 5,592,327 A | 1/1997 | Gabl et al. | 359/348 |
| 5,627,848 A | 5/1997 | Fermann et al. | 372/18 |
| 5,653,900 A | 8/1997 | Clement et al. | 219/121.68 |
| 5,654,998 A | 8/1997 | Turcu et al. | 378/119 |
| 5,656,186 A | 8/1997 | Mourou et al. | 219/121.69 |
| 5,662,822 A | 9/1997 | Tada et al. | 219/121.67 |
| 5,669,979 A | 9/1997 | Elliott et al. | 134/1 |
| 5,685,995 A | 11/1997 | Sun et al. | 219/121.6 |
| 5,689,519 A | 11/1997 | Fermann et al. | 372/18 |
| 5,694,408 A | 12/1997 | Bott et al. | 372/6 |
| 5,701,319 A | 12/1997 | Fermann | 372/18 |
| 5,720,894 A | 2/1998 | Neev et al. | 216/65 |
| 5,725,914 A | 3/1998 | Opower | 427/592 |
| 5,730,811 A | 3/1998 | Azad et al. | |
| 5,739,590 A | 4/1998 | Sakamoto et al. | 257/775 |
| 5,742,634 A | 4/1998 | Rieger et al. | 372/25 |
| 5,745,284 A | 4/1998 | Goldberg et al. | 359/344 |
| 5,751,585 A | 5/1998 | Cutler et al. | 364/474.03 |
| 5,756,924 A | 5/1998 | Early | 102/201 |
| 5,759,428 A | 6/1998 | Balamane et al. | 219/121.62 |
| 5,786,560 A | 7/1998 | Tatah et al. | 219/121.77 |
| 5,790,574 A | 8/1998 | Rieger et al. | 372/25 |
| 5,811,751 A | 9/1998 | Leong et al. | 219/121.6 |
| 5,812,569 A | 9/1998 | Walker et al. | 372/30 |
| 5,818,630 A | 10/1998 | Fermann et al. | 359/341 |
| 5,822,345 A | 10/1998 | Sousa et al. | |
| 5,837,962 A | 11/1998 | Overbeck | 219/121.68 |
| 5,841,099 A | 11/1998 | Owen et al. | 219/121.69 |
| 5,847,960 A | 12/1998 | Cutler et al. | 364/474.29 |
| 5,848,080 A | 12/1998 | Dahm | 372/25 |
| 5,854,805 A | 12/1998 | Reid et al. | 372/70 |
| 5,864,430 A | 1/1999 | Dickey et al. | 359/559 |
| 5,867,305 A | 2/1999 | Waarts et al. | 359/341 |
| 5,880,877 A | 3/1999 | Fermann et al. | 359/341 |
| 5,920,668 A | 7/1999 | Uehara et al. | 385/27 |
| 5,923,686 A | 7/1999 | Fermann et al. | 372/18 |
| 5,925,271 A | 7/1999 | Pollack et al. | 219/121.74 |
| 5,933,271 A | 8/1999 | Waarts et al. | 359/341 |
| 5,940,418 A | 8/1999 | Shields | 372/22 |
| 5,953,354 A | 9/1999 | Staver et al. | 372/18 |
| 5,956,354 A | 9/1999 | Yan | 372/18 |
| 5,966,339 A | 10/1999 | Hsu et al. | |
| 5,974,060 A | 10/1999 | Byren et al. | 372/19 |
| 5,987,049 A | 11/1999 | Weingarten et al. | 372/70 |
| 5,998,759 A | 12/1999 | Smart | 219/121.69 |
| 6,014,249 A | 1/2000 | Fermann et al. | 359/341 |
| 6,025,256 A | 2/2000 | Swenson et al. | 438/601 |
| 6,034,975 A | 3/2000 | Harter et al. | 372/18 |
| 6,057,180 A | 5/2000 | Sun et al. | 438/132 |
| 6,072,811 A | 6/2000 | Fermann et al. | 372/11 |
| 6,097,741 A | 8/2000 | Lin et al. | 372/6 |
| 6,103,992 A | 8/2000 | Noddin | 219/121.71 |
| 6,144,118 A | 11/2000 | Cahill et al. | 310/12 |
| 6,150,630 A | 11/2000 | Perry et al. | 219/121.68 |
| 6,151,338 A | 11/2000 | Grubb et al. | 372/6 |
| 6,156,030 A | 12/2000 | Neev | 606/10 |
| 6,169,014 B1 | 1/2001 | McCulloch | 438/487 |
| 6,172,325 B1 | 1/2001 | Baird et al. | 219/121.62 |
| 6,181,728 B1 | 1/2001 | Cordingley et al. | 372/106 |
| 6,191,486 B1 | 2/2001 | Bernstein | 257/776 |
| 6,208,458 B1 | 3/2001 | Galvanauskas et al. | 359/345 |
| 6,210,401 B1 | 4/2001 | Lai | 606/12 |
| 6,211,485 B1 | 4/2001 | Burgess | 219/121.7 |
| 6,239,406 B1 | 5/2001 | Onoma et al. | 219/121.82 |
| 6,252,195 B1 | 6/2001 | Mosavi et al. | 219/121.69 |
| 6,268,586 B1 | 7/2001 | Stuart et al. | 219/121.72 |
| 6,281,471 B1 | 8/2001 | Smart | 219/121.62 |
| 6,285,002 B1 | 9/2001 | Ngoi et al. | 219/121.73 |
| 6,297,541 B1 | 10/2001 | Ema et al. | 257/665 |
| 6,300,590 B1 | 10/2001 | Lauer et al. | 219/121.6 |
| 6,324,195 B1 | 11/2001 | Suzuki et al. | 372/25 |
| 6,335,941 B1 | 1/2002 | Grubb et al. | 372/6 |
| 6,339,604 B1 | 1/2002 | Smart | 372/26 |
| 6,340,806 B1 | 1/2002 | Smart et al. | 219/121.69 |
| 6,341,029 B1 | 1/2002 | Fillion et al. | 359/212 |
| RE37,585 E | 3/2002 | Mourou et al. | 219/121.69 |
| 6,407,363 B2 | 6/2002 | Dunsky et al. | 219/121.71 |
| 6,421,166 B1 | 7/2002 | Velsko et al. | 359/330 |
| 6,433,301 B1 | 8/2002 | Dunsky et al. | 219/121.67 |
| 6,441,337 B1 | 8/2002 | Isaji et al. | 219/121.62 |
| 6,462,306 B1 | 10/2002 | Kitai et al. | 219/121.77 |
| 6,472,295 B1 | 10/2002 | Morris et al. | 438/463 |
| 6,483,071 B1 | 11/2002 | Hunter et al. | 219/121.6 |
| 6,501,061 B1 | 12/2002 | Kitai et al. | 250/205 |

| | | | |
|---|---|---|---|
| 6,518,540 B1 | 2/2003 | Wee et al. | 219/121.61 |
| 6,541,731 B2 | 4/2003 | Mead et al. | 219/121.7 |
| 6,552,301 B2 | 4/2003 | Herman et al. | 219/121.71 |
| 6,574,250 B2 | 6/2003 | Sun et al. | 372/25 |
| 6,580,055 B2 | 6/2003 | Iso | 219/121.7 |
| 6,593,542 B2 | 7/2003 | Baird et al. | 219/121.68 |
| 6,603,910 B2 | 8/2003 | Islam et al. | 385/123 |
| 6,621,040 B1 | 9/2003 | Perry et al. | 219/121.67 |
| 6,621,041 B2 | 9/2003 | Hayashi et al. | 219/121.67 |
| 6,664,498 B2 | 12/2003 | Forsman et al. | 219/121.6 |
| 6,678,061 B2 | 1/2004 | Kilthau et al. | 356/614 |
| 6,689,985 B2 | 2/2004 | Lipman et al. | 219/121.7 |
| 6,703,582 B2 | 3/2004 | Smart et al. | 219/121.62 |
| 6,710,289 B2 | 3/2004 | Iso | 219/121.7 |
| 6,717,101 B2 | 4/2004 | Morris et al. | 219/121.67 |
| 6,727,458 B2 * | 4/2004 | Smart | 219/121.62 |
| 6,738,396 B2 | 5/2004 | Filgas et al. | 372/19 |
| 6,777,645 B2 | 8/2004 | Ehrmann et al. | 219/121.73 |
| 6,785,304 B2 | 8/2004 | Filgas | 372/19 |
| 6,838,639 B2 | 1/2005 | Kreuter et al. | 219/121.76 |
| 6,849,824 B2 | 2/2005 | Arai et al. | 219/121.7 |
| 6,875,951 B2 | 4/2005 | Sakamoto et al. | 219/121.73 |
| 6,878,899 B2 | 4/2005 | Smart | 219/121.61 |
| 6,879,605 B2 | 4/2005 | Kyusho et al. | 372/25 |
| 6,887,804 B2 | 5/2005 | Sun et al. | 438/940 |
| 6,901,090 B1 | 5/2005 | Ohtsuki | 372/26 |
| 6,911,622 B2 | 6/2005 | Lauer et al. | 219/121.69 |
| 6,947,123 B1 | 9/2005 | Ohtsuki | 355/67 |
| 6,951,995 B2 | 10/2005 | Couch et al. | 219/121.67 |
| 6,972,268 B2 | 12/2005 | Ehrmann et al. | 438/795 |
| 6,989,508 B2 | 1/2006 | Ehrmann et al. | 219/121.73 |
| 6,995,841 B2 | 2/2006 | Scott et al. | 356/318 |
| 2001/0009250 A1 | 7/2001 | Herman et al. | 219/121.69 |
| 2001/0022673 A1 | 9/2001 | Sato et al. | 358/480 |
| 2001/0050931 A1 | 12/2001 | Iso | 372/25 |
| 2002/0003130 A1 | 1/2002 | Sun et al. | 219/121.68 |
| 2002/0033387 A1 | 3/2002 | Kurosawa et al. | |
| 2002/0063361 A1 | 5/2002 | Fahey | 264/400 |
| 2002/0162360 A1 | 11/2002 | Schaffer et al. | 65/392 |
| 2002/0167581 A1 | 11/2002 | Cordingley et al. | 347/173 |
| 2003/0042230 A1 | 3/2003 | Gross et al. | 219/121.7 |
| 2003/0146196 A1 | 8/2003 | Kurosawa et al. | |
| 2003/0151053 A1 | 8/2003 | Sun et al. | 257/79 |
| 2003/0161375 A1 | 8/2003 | Filgas et al. | 372/66 |
| 2003/0222324 A1 | 12/2003 | Sun et al. | 257/431 |
| 2004/0057475 A1 | 3/2004 | Frankel et al. | 372/25 |
| 2004/0134894 A1 | 7/2004 | Gu et al. | 219/121.68 |
| 2004/0134896 A1 | 7/2004 | Gu et al. | 219/121.69 |
| 2004/0188399 A1 | 9/2004 | Smart | 219/121.69 |
| 2004/0228004 A1 | 11/2004 | Sercel et al. | 359/668 |
| 2005/0041702 A1 | 2/2005 | Fermann et al. | 372/25 |
| 2005/0092720 A1 | 5/2005 | Gu et al. | 219/121.69 |
| 2005/0115936 A1 | 6/2005 | Gu et al. | 219/121.69 |
| 2005/0115937 A1 | 6/2005 | Gu et al. | 219/121.69 |
| 2005/0150879 A1 | 7/2005 | Gu et al. | 219/121.69 |
| 2005/0150880 A1 | 7/2005 | Gu et al. | 219/121.69 |
| 2006/0086702 A1 | 4/2006 | Smart | |

FOREIGN PATENT DOCUMENTS

| | | |
|---|---|---|
| EP | 0 902 474 A2 | 3/1999 |
| GB | 2 331 038 A | 5/1999 |
| JP | 55-081095 | 6/1980 |
| JP | 56-143434 | 11/1981 |
| JP | 62-086839 | 4/1987 |
| JP | 63-005891 | 1/1988 |
| JP | 63-136545 | 6/1988 |
| JP | 63-264286 | 11/1988 |
| JP | S63-289548 | 11/1988 |
| JP | 63-302503 | 12/1988 |
| JP | 64-044295 | 2/1989 |
| JP | 01-289586 | 11/1989 |
| JP | 02-063103 | 3/1990 |
| JP | 02-089586 | 3/1990 |
| JP | 03-297588 | 12/1991 |
| JP | 2004-006599 | 1/1992 |
| JP | 04-098801 | 3/1992 |
| JP | 2005-235169 | 9/1993 |
| JP | 06-142968 | 5/1994 |
| JP | 07-124764 | 5/1995 |
| JP | 11-773 I | 1/1999 |
| JP | 11-170072 | 6/1999 |
| JP | 2000-208798 | 7/2000 |
| JP | 2001-170788 | 6/2001 |
| JP | 2001-269790 | 10/2001 |
| JP | 2003-053575 | 2/2003 |
| JP | 2003-053576 | 2/2003 |
| JP | 2003-133690 | 5/2003 |
| JP | 2004-510305 | 4/2004 |
| WO | WO 96/16484 | 5/1996 |
| WO | WO 98/28104 | 7/1998 |
| WO | WO 98/31049 | 7/1998 |
| WO | WO 98/42050 | 9/1998 |
| WO | WO 98/52257 | 11/1998 |
| WO | WO 98/53949 | 12/1998 |
| WO | WO 01/87534 A2 | 11/2001 |
| WO | WO 03/047807 A1 | 6/2003 |
| WO | WO 03/052890 A1 | 6/2003 |

OTHER PUBLICATIONS

Spectra-Physics, *TSUNAMI, The First Choice in Mode-Locked Ti:Sapphire Lasers*.

Spectra-Physics, *OPAL, The First Synchronously Pumped Optical Parametric Oscillator*.

Spectra-Physics, *MAI TAI. The First Tunable One-Box Ti:Sapphire Femtosecond Laser Source*.

U.S. Provisional Appl. No. 60/233,914 of Fahey, filed Sep. 20, 2000.

Charles L. Gholz , Nov. 17, 2005, letter to Michael Levine.

Bernstein et al., "Metal wire cutting by repeated application of low-power laser pulses," Rev. Sci. Instrum. 63(6) Jun. 1992, pp. 3516-3518.

North et al.., Laser Coding of Bipolar Read-Only Memories, IEEE Journalof Solid State Circuits vol. Sc-11, No. 4 (1976).

Purported Computer-Generated English Abstract and Purported English Translation of Japanese Publication No. 63-005891(Reference GE).

Amendment filed Nov. 23, 2005, U.S. Appl. No. 10/818,920.

Declaration of Joseph B. Bernstein, filed Nov. 7, 2005, U.S. Appl. No. 10/818,920.

Anderson, Stephen G., Solid-State UV Lasers Drill Vias Effectively, Laser Focus World, Feb. 1996, pp. 31-32.

Bado, Philippe, Micromachine with Ultrafast Pulsing, Optoelectronics World, Supplement to Laser Focus World, Jun. 2001, pp. 205-06.

Bado, Philippe, Ultrafast Lasers Escape the Lab, Photonics Spectra, Jul. 1998, pp. 157-61.

Bernstein, Joseph B. et al., Analysis of Laser Metal-Cut Energy Process Window (Apparently still "unpublished," but apparently first cited in an IDS to U.S. Appl. No. 10/107,890 on Mar. 24, 2003).

Bernstein, Joseph B. et a.l, Laser Energy Limitation for Buried Metal Cuts, available at http://www.enre.umd.edu/JB/paper1/, Mar. 17, 2000,5 pp.

Bloembergen, N., From Nanosecond to Femtosecond Science, Rev. Mod. Phys., vol. 71, No. 2, Centenary 1999 Amer. Phys. Soc., pp. 5283-5287.

Boogaard, Jerry, Precision Laser Micromachining, SPIE, vol. 611, Portland, Oregon, 1986, pp. 48-59.

Bostanjoglo, 0. et al., Ablation of Metal Films by Picosecond Laser Pulses Imaged with High-Speed Electron Microscopy, J. Appl. Phys. 76(5), Sept. 1, 1994, pp. 3045-48.

Cacouris, Ted, Preventing Cross-Contamination Caused by Copper Diffusion, Yield Management Solutions, Autumn 1999, pp. C13-C17.

Charschan, Sidney S., Guide for Material Processing by Lasers, Laser Institute of America, the Paul M. Harrod Company, Baltimore, MD., 1977, pp. 5-1 to 5-15.

Chichkov, B. N. et al., Femtosecond, Picosecond and Nanosecond Laser Ablation of Solids, Applied Physics A 63, 1996, pp. 109-15.

Cohen, Simon S. et al., Laser Beam Processing and Wafer-Scale Integration, 1988, pp. 85-111.

Corkum, P. B. et al., Thermal Response of Metals to Ultrashort-Pulse Laser Excitation, Physical Review Letters, vol. 61, No. 25, Dec. 19, 1988, pp. 2886-89.

Du, D. et al., Laser-Induced Breakdown by Impact Ionization in $SiO_2$ with Pulse Widths from 7 ns. To 150 fs Appl. Phys. Lett. 64 (23), Jun. 6, 1994, pp. 3071-73.

Elliot, David J., Ultraviolet Laser Technology and Applications, 1995, pp. 136-41.

Fauchet, P. M. et al., Surface Ripples on Silicon and Gallium Arsenide Under Picosecond Laser Illumination, Appl. Phys. Lett. 40(9), May 1, 1982, pp. 824-26.

Fluck, R. et al., Passively $Q$-switched 1.34-μM Nd:YVO$^4$ Microchip Laser with Semiconductor Saturable-Absorber Mirrors, Optics Letters, vol. 22, No. 13, Jul. 1, 1997, pp. 991-93.

Gitin, Mark, UV Lasers: State of the Art Is All-Solid-State, Photonics Spectra, Sept. 1998, pp. 136-39.

Gotz, T. et al., Short-Pulse UV Laser Ablation of Solid and Liquid Metals: Indium, Appl. Phys. A 64 (1977), pp. 539-43.

Gu, Jianhui et al., Passive $Q$-Switching of a Nd:YAG Laser with a GaAs Output Coupler, Optical Engineering 38(1), Nov. 1999, pp. 1785-88..

Haight, Richard et al., Implementation and Performance of a Femtosecond Laser Mask Repair System in Manufacturing, Presented at 1998 SPIE BACUS Meeting, 8 pp.

Haneman, D. et al., Surface Topography of Laser Annealed Silicon, Solid State Communications, vol. 43, No. 3, 1982; pp. 203-06.

Herman, P.R. et al., Laser Micromachining of Transparent Glasses and Aluminum with ps-Pulse Bursts at 1054 nm, CLEO 2000, CDF3 (2000), p. 580.

Higgins, Jim, Excimer Lasers Machine in the UV, Optoelectronics World, Supplement to Laser Focus World, Jun. 2001, pp. 183-86.

Hoogland, S. et al., Passively Mode-Locked Diode-Pumped Surface-Emitting Semiconductor Laser, IEEE Photonics Technology Letters, vol. 12, No. 9, Sept. 2000, pp. 1135-37.

Ippen, E.P. et al., Picosecond Pulse Generation by Passive Mode Locking of Diode Lasers, Applied Physics Lett 37(3) Aug. 1, 1980, pp. 267-69.

Jandeleit, J. et al., Picosecond Laser Ablation of Thin Copper Films, Appl. Phys A, 63, 1996, pp. 117-21.

Kauf, Michael, et al., Microvia Formation in PCBs, Optoelectronics World, Supplement to Laser Focus World, Jun. 2001, pp. 227-28, 230-31.

Kautek, W. et al., Femtosecond-Pulse Laser Microstructuring of Semiconducting Materials, Materials Science Forum, vols. 173-174, 1995, pp. 17-22.

Keirstead, Mark et al., UV Lasers Are Workhorses, Optoelectronics World, Supplement to Laser Focus World, Jun. 2001, pp. 197-201.

Keller, Ursula et al., Semiconductor Saturable Absorber Mirrors (SESAM's) for Femtosecond to Nanosecond Pulse Generation in Solid-State Lasers, IEEE Journal of Selected Topics in Quantum Electronics, vol. 2, No. 3, Sept. 1996, pp. 435-53.

Keller, Ursula, Recent Developments in Compact Ultrafast Lasers, Nature, vol. 424, Aug. 14, 2003, pp. 831-38.

Kilgo, Marvin, Excimer Lasers Target Material Ablation, Optoelectronics World, Supplement to Laser Focus World, Jun. 2001, pp. 191-94.

Krüger, Jörge et al., Femtosecond-Pulse Laser Processing of Metallic and Semiconducting Thin Films, SPIE, vol . 2403, 1995, pp. 436-47.

Kyusho, Yukio et al., High-Energy Subnanosecond Compact Laser System with Diode-Pumped, Q-Switched Nd:YVO$_4$ Laser, OSA TOPS on Advanced Solid-State Lasers, vol. 1, 1996, pp. 38-85.

Lenzner, M. et al., Precision Laser Ablation of Dielectrics in the 10-fs Regime, Appl. Phys. A. 68 (1999), 369-71.

Litwin, A. et al., Laser Adjustment of Linear Monolithie Circuits, Laser Institute of America, vol. 38, ICALEO, 1983, p. 32.

Liu, Hsiao-Hua et al., Effects of Wavelength and Doping Concentration on Silicon Damage Threshold, 2003, pp. 1-2.

Liu, Xibing et al., Ultrashort Laser Pulses Tackle Precision Machining, Laser Focus World, Aug. 1997, pp. 101-18.

Marine, W. et al., Laser Induced Plasma Formation by Picosecond Pulse Irradiation, Applied Surface Science 69 (1993) pp. 290-98.

Marine, W. et al., Picosecond YAG Laser Photoablation of Amorphous Silicon, Applied Surface Science 46, 1990, pp. 239-44.

Martin, Philippe et al., Electron and Ion Emission in High-Intensity Laser Irradiation of Aluminum, Phys. Rev. B. vol. 45, No. 1, Jan. 1, 1992-I, pp. 69-77.

Mitani, Masao et al., Laser Cutting of Aluminum Thin Film with No Damage to Under-Layers, Annals of the CIRP, vol. 28/1, 1979, pp. 113-16.

Moser, David, Lasers Tool Up for Via Formation, Optoelectronics World, Supplement to Laser Focus World, Jun. 2001, pp. 213-14.

Ngoi, Bryan K. A. et al., Submicron Micromachining on Silicon Wafer Using Femtosecond Pulse Laser, Journal of Laser Applications, vol. 13, No. 1, Feb. 2001, pp. 41-43.

Nolte, S, et al., Ablation of Metals by Ultrashort Laser Pulses, J. Optical Society Am. B, vol. 14, No. 10, Oct. 1997, pp.2716-22.

North, J. C., Laser Vaporization of Metal Films-Effect of Optical Interference in Underlying Dielectric Layers, Journal of Applied Physics, vol. 48, No. 6, Jun. 1977, pp. 2419-23.

Novellus (Damascus), Benefits of Copper - Copper Technology Is Here Today in Working Devices, Feb. 20, 2001, 18 pp.

Paschotta, R. et al., Passive Mode Locking with Slow Saturable Absorbers, Applied Physics B-Lasers and Optics 73 (2001), pp. 653-62.

Pasmanik, Guerman, Pico Versus Femto in Micromachining, Optoelectronics World, Supplement to Laser Focus World, Jun. 2001, pp. 221-22, 224.

Patel, R.S. et al., Via Production Benefits From Excimer-Laser Tools, Laser Focus World, Jan. 1996, pp. 71-75.

Pronko, P.P. et al., Thermophysical Effects in Laser Processing of Materials with Pecosecond and Femtosecond Pulses, J. Appl. Phys. 78(10), Nov. 15, 1995, pp. 6233-40.

Raevsky, Eugene V. et al., Stabilizing the Output of a Pockels Cell $Q$Swithched Nd:YAG Laser, Opt, Eng. 38(11), Nov. 1999, pp. 1781-84.

Ready, John F. et al., Link Cutting/Making, LIA Handbook of Laser Materials Processing, Chapter 19, 2001, pp. 595-615.

Ready, John F. et al., Overview of Laser Materials Processing, LIA Handbook of Laser Materials Processing, Chapter 1, 2001, pp. 7-9.

Ready, John F. et al., Ultrafast Lasers for Materials Processing, LIA Handbook of Laser Materials Processing, Chapter 2, 2001, p. 82.

Ready, John F. et al., Ultrashort-Pulse Laser Machining, LIA Handbook of Laser Materials Processing, Chapter 13, 2001, pp. 499-508.

Ready, John F., Effects of High-Power Laser Radiation, Academic Press, New York, 1971, pp. 115-16.

Rossi, Brian, Fiber Lasers Target Manufacturing, Optoelectronics World, Supplement to Laser Focus World, Jun. 2001, pp. 209-10.

Rubenchik, A. M. et al., Numerical Simulation of Ultra-Short Laser Pulse Energy Deposition and Bulk Transport for Material Processing, Appl. Surface Sci. 127-129 (1998), pp. 193-98.

Scarfone, L. M. et al., Computer Simulation of Target Link Explosion in Laser Programmable Redundancy for Silicon Memory, J. Mater. Res. 1(2), Mar./Apr. 1986, pp. 368-81.

Schaeffer, Ronald D., A Closer Look at Laser Ablation, Optoelectronics World, Supplement to Laser Focus World, Jun. 2001, pp. 217-19.

Shank, C. V. et al, Time-Resolved Reflectivity Measurements of Femtosecond-Optical-Pulse-induced Phase Transitions in Silicon, Physical Review Letters, Vol. 50, No. 6, Feb. 7, 1983, pp. 454-57.

Simon, P. et al., Ablation of Submicron Structures on Metals and Semiconductors by Femtosecond Uv-Laser Pulses, Applied Surface Science 109/110 (1997), pp. 25-29.

Simon, P. et al., Machining of Submicron Structures on Metals and Semiconductors by Ultrashort UV-Laser.

Smart, Don, Optimization of Semiconductor Layer Thicknesses for Repair of RAMs, Application Report 150, Teradyne ( ), 9 pp.

Smart, Donald V. et al., Laser Processing for Application Specific Integrated Circuits (ASICs), SPIE, vol. 774, 1987, pp. 88-92.

Spohler, G. J. et al., Output-Coupling Semiconductor Saturable Absorber Mirror, Applied Physics Letters, vol. 78, No. 18, Apr. 30, 2001, pp. 2733-35.

Srivatsa, Arun R. et al., Measurement of Advanced Low K Materials, Semiconductor Fabtech, 9$^{th}$ Edition, ( ), pp. 271-76.

Stuart, B. C. et al., Optical Ablation by High-Power Short-Pulse Lasers, J. Op. Soc. Am. B, vol. 13, No. 2, Feb. 1996, pp. 459-68.

Stuart, B. C. et al., Ultrashort-Pulse Optical Damage, SPIE, vol. 2714, 1996, pp. 616-29.

Subrahmanyan, Pradeep K., Laser Micromachining in the Microelectronics Industry: Emerging Applications, Proceedings of SPIE, vol. 4977, 2003, pp. 188-97.

Sun, Yunlong et al., Optimization of Memory Redundancy Link Processing, SPIE, vol. 2636, 1995, pp. 152-64.

Sun, Yunlong, Interference Effect on Laser Trimming and Layer Thickness Optimization, SPIE, vol. 1598, 1991, pp. 91-97.

Tatterson, Kathleen G., Fiber Laser Sets a Record, Photonics Spectra, Aug. 1997, *available at* http://www.photonics.com/content/spectra/1997/August/tech/78391.aspx, 2 pp.

Von Der Linde, D. et al., Breakdown Threshold and Plasma Formation in Femtoiecond Laser-Solid Interaction, J. Opt. Soc. Am. B, vol. 13, No. 1, Jan. 1996, pp. 216-22.

Von Gutfeld, Robert J., Laser Processing of Integrated Circuits and Microelectronic Materials, Laser Applications, vol. 5, 1984, pp. 1-18, 64-67.

Washio, Kunihiko, Laser Applications in Electronics and Optoelectronics Industry in Japan, SPIE, vol. 3618, Jan. 1999, pp. 230-39.

Washio, Kunihiko, Laser Processing: Principles and Advanced Applications—Part 2, International Symposium on Microelectronics and Assembly, ISMA '97 Educational Short Courses, Jun. 24, 1977, pp. 1-101.

Xenon Laser Repairs Liquid-Crystal Displays, Lasers & Optronics, Apr. 1988, pp. 39-41.

Zayhowski, John, Q-Switched Microchip Lasers Find Real-World Application, Laser Focus World, Aug. 1999, pp. 129-36.

Zhang, W. et al., Modelling and Analysis of UV Laser Micromachining of Copper, Int. J. Adv. Manuf. Tech. (2001) 18, pp. 323-31.

Zhang, Zhuhong et al., Gallium Arsenide: A New Material to Accomplish Passively Mode-Locked Nd:YAG Laser, Applied Physics Lett., vol. 60, No. 4, Jan. 27, 1992, pp. 419-21.

Zhao, J.-X., Micromachining with Ultrashort Laser Pulses, SPIE, vol. 3618, Jan. 1999, pp. 114-21.

Zhu, X. et al., Influence of Laser Parameters and Material Properties on Micro Drilling with Femtosecond Laser Pulses, Applied Physics A, 69, 1999, pp. S367-S371.

Zhu, Xiaonong, on Ultrashort Laser Pulse Machining, Optoelectronics World, Supplement to Laser Focus World, Jun. 2001, pp. 1-8.

Smart, Donald V., Link Processing with Lasers, 1998, pp. 1-20.

Siegman, Active Laser Mode Coupling, Uninversity Science Books, 1986, pp. 1041-1132.

Lapczyna, M., et al., Ultra High Repetition Rate (133 MHz) Laser Ablation of Aluminum with 1.2-ps. Pulses; Applied Physics A Materials Science & Processing, Springer-Verlag, 1999, pp. S883-S886.

Majorbanks, R.S., et al., High-Contrast Terawatt Chirped-pulse-amplification Laser That Uses a 1-ps. Nd:glass Oscillator; Mar. 1, 1993, vol. 18, No. 5, Optics Letters, pp. 361-363.

Smart, Link Cutting/Making, 2001, pp. 595-615.

Electronics Review, vol. 41, No. 26, Dec. 23, 1968, p. 37.

Bernstein. Joseph B. et al., Laser Energy Limitation for Buried Metal Cuts, IEEE Election Device Letters, Jan. 1998. pp. 1-5. vol. 19, No. 1, College Park, Maryland.

Muller, Henrich G. et al., Laser Process for Personalization and Repair of Multi-Chip-Modules, Microelectronics and Computer Technology Corp., Austin, Manufacturing, 1991. pp. 132-140.

Office action, EP 01 901 912.4 —2203, European Patent Office, Mar. 15, 2006.

Office action, EP 01 901 912.4 —2203, European Patent Office, Oct. 17, 2006.

U.S. Appl. No. 60/279,644, filed Nov. 7, 2002, Ehrmann et al.

Dec. 23, 2008 Examiner's answer in connection with U.S. Appl. No. 10/818,920.

Office action in connection with Japanese Patent Application No. 553,680/2003, Japanese Patent Office, Jul. 22, 2008, and English translation thereof.

Jul. 15, 2008 Office action in connection with U.S. Appl. No. 11/305,129.

Jun. 12, 2008 Supplemental Reply Brief in connection with U.S. Appl. No. 10/818,920.

\* cited by examiner

US 7,671,295 B2

PROCESSING A MEMORY LINK WITH A SET OF AT LEAST TWO LASER PULSES

RELATED APPLICATIONS

This patent application derives priority from U.S. Provisional Application No. 60/341,744, filed Dec. 17, 2001, and is a continuation-in-part of U.S. patent application Ser. No. 09/757,418, filed Jan. 9, 2001, now U.S. Pat. No. 6,574,250, which claims priority from both U.S. Provisional Application No. 60/223,533, filed Aug. 4, 2000 and U.S. Provisional Application No. 60/175,337, filed Jan. 10, 2000.

TECHNICAL FIELD

The present invention relates to laser processing of memory or other IC links and, in particular, to a laser system and method employing a set of at least two laser pulses to sever an IC link on-the-fly.

BACKGROUND OF THE INVENTION

Yields in IC device fabrication processes often incur defects resulting from alignment variations of subsurface layers or patterns or particulate contaminants. FIGS. 1, 2A, and 2B show repetitive electronic circuits 10 of an IC device or work piece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable conductive links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program a logic product, gate arrays, or ASICs.

Links 22 are about 0.3-2 microns (μm) thick and are designed with conventional link widths 28 of about 0.4-2.5 μm, link lengths 30, and element-to-element pitches (center-to-center spacings) 32 of about 2–8 μm from adjacent circuit structures or elements 34, such as link structures 36. Although the most prevalent link materials have been polysilicon and like compositions, memory manufacturers have more recently adopted a variety of more conductive metallic link materials that may include, but are not limited to, aluminum, copper, gold, nickel, titanium, tungsten, platinum, as well as other metals, metal alloys, metal nitrides such as titanium or tantalum nitride, metal silicides such as tungsten suicide, or other metal-like materials.

Circuits 10, circuit elements 14, or cells 20 are tested for defects, the locations of which may be mapped into a database or program. Traditional 1.047 μm or 1.064 μm infrared (IR) laser wavelengths have been employed for more than 20 years to explosively remove conductive links 22. Conventional memory link processing systems focus a single pulse of laser output having a pulse width of about 4 to 30 nanoseconds (ns) at each link 22. FIGS. 2A and 2B show a laser spot 38 of spot size (area or diameter) 40 impinging a link structure 36 composed of a polysilicon or metal link 22 positioned above a silicon substrate 42 and between component layers of a passivation layer stack including an overlying passivation layer 44 (shown in FIG. 2A but not in FIG. 2B), which is typically 500–10,000 angstrom (Å) thick, and an underlying passivation layer 46. Silicon substrate 42 absorbs a relatively small proportional quantity of IR radiation, and conventional passivation layers 44 and 46 such as silicon dioxide or silicon nitride are relatively transparent to IR radiation. The links 22 are typically processed "on-the-fly" such that the beam positioning system does not have to stop moving when a laser pulse is fired at a link 22, with each link 22 being processed by a single laser pulse. The on-the-fly process facilitates a very high link-processing throughput, such as processing several tens of thousands of links 22 per second.

FIG. 2C is a fragmentary cross-sectional side view of the link structure of FIG. 2B after the link 22 is removed by the prior art laser pulse. To avoid damage to the substrate 42 while maintaining sufficient energy to process a metal or nonmetal link 22, Sun et al. in U.S. Pat. No. 5,265,114 and U.S. Pat. No. 5,473,624 proposed using a single 9 to 25 ns pulse at a longer laser wavelength, such as 1.3 μm, to process memory links 22 on silicon wafers. At the 1.3 μm laser wavelength, the absorption contrast between the link material and silicon substrate 20 is much larger than that at the traditional 1 μm laser wavelengths. The much wider laser processing window and better processing quality afforded by this technique has been used in the industry for about five years with great success.

The 1.0 μm and 1.3 μm laser wavelengths have disadvantages however. The coupling efficiency of such IR laser beams 12 into a highly electrically conductive metallic link 22 is relatively poor; and the practical achievable spot size 40 of an IR laser beam for link severing is relatively large and limits the critical dimensions of link width 28, link length 30 between contacts 24, and link pitch 32. This conventional laser link processing relies on heating, melting, and evaporating link 22, and creating a mechanical stress build-up to explosively open overlying passivation layer 44 with a single laser pulse. Such a conventional link processing laser pulse creates a large heat affected zone (HAZ) that could deteriorate the quality of the device that includes the severed link. For example, when the link is relatively thick or the link material is too reflective to absorb an adequate amount of the laser pulse energy, more energy per laser pulse has to be used. Increased laser pulse energy increases the damage risk to the IC chip. However, using a laser pulse energy within the risk-free range on thick links often results in incomplete link severing.

U.S. Pat. No. 6,057,180 of Sun et al. and U.S. Pat. No. 6,025,256 of Swenson et al. more recently describe methods of using ultraviolet (UV) laser output to sever or expose links that "open" the overlying passivation by different material removal mechanisms and have the benefit of a smaller beam spot size. However, removal of the link itself by such a UV laser pulse entails careful consideration of the underlying passivation structure and material to protect the underlying passivation and silicon wafer from being damaged by the UV laser pulse.

U.S. Pat. No. 5,656,186 of Mourou et al. discloses a general method of laser induced breakdown and ablation at several wavelengths by high repetition rate ultrafast laser pulses, typically shorter than 10 ps, and demonstrates creation of machined feature sizes that are smaller than the diffraction limited spot size.

U.S. Pat. No. 5,208,437 of Miyauchi et al. discloses a method of using a single "Gaussian"-shaped pulse of a sub-nanosecond pulse width to process a link.

U.S. Pat. No. 5,742,634 of Rieger et al. discloses a simultaneously Q-switched and mode-locked neodymium (Nd) laser device with diode pumping. The laser emits a series of pulses each having a duration time of 60 to 300 picoseconds (ps), under an envelope of a time duration of 100 ns.

SUMMARY OF THE INVENTION

An object of the present invention is to provide a method or apparatus for improving the quality of laser processing of IC links.

Another object of the invention is to process a link with a set of low energy laser pulses.

A further object of the invention is to process a link with a set of low energy laser pulses at a shorter wavelength.

Yet another object of the invention is to employ such sets of laser pulses to process links on-the-fly.

The present invention employs a set of at least two laser pulses, each with a laser pulse energy within a safe range, to sever an IC link, instead of using a single laser pulse of conventional link processing systems. This practice does not, however, entail either a long dwell time or separate duplicative scanning passes of repositioning and refiring at each link that would effectively reduce the throughput by factor of about two. The duration of the set is preferably shorter than 1,000 ns, more preferably shorter than 500 ns, most preferably shorter than 300 ns and preferably in the range of 5 to 300 ns; and the pulse width of each laser pulse within the set is generally in the range of 100 femtoseconds (fs) to 30 ns. Each laser pulse within the set has an energy or peak power per pulse that is less than the damage threshold for the silicon substrate supporting the link structure. The number of laser pulses in the set is controlled such that the last pulse cleans off the bottom of the link leaving the underlying passivation layer and the substrate intact. Because the whole duration of the set is shorter than 1,000 ns, the set is considered to be a single "pulse" by a traditional link-severing laser positioning system. The laser spot of each of the pulses in the set encompasses the link width and the displacement between the laser spots of each pulse is less than the positioning accuracy of a typical positioning system, which is typically +−0.05 to 0.2 μm. Thus, the laser system can still process links on-the-fly, i.e. the positioning system does not have to stop moving when the laser system fires a set of laser pulses at each selected link.

In one embodiment, a continuous wave (CW) mode-locked laser at high laser pulse repetition rate, followed by optical gate and an amplifier, generates sets having ultrashort laser pulses that are preferably from about 100 fs to about 10 ps. In another one embodiment, a Q-switched and CW mode-locked laser generates sets having ultrashort laser pulses that are preferably from about 100 fs to about 10 ps. Because each laser pulse within the burst set is ultrashort, its interaction with the target materials (passivation layers and metallic link) is substantially not thermal. Each laser pulse breaks off a thin sublayer of about 100–2,000 Å of material, depending on the laser energy or peak power, laser wavelength, and type of material, until the link is severed. This substantially nonthermal process may mitigate certain irregular and inconsistent link processing quality associated with thermal-stress explosion behavior of passivation layers 44 of links 22 with widths narrower than about 1 μm. In addition to the "nonthermal" and well-controllable nature of ultrashort-pulse laser processing, the most common ultrashort-pulse laser source emits at a wavelength of about 800 nm and facilitates delivery of a small-sized laser spot. Thus, the process may facilitate greater circuit density.

In another embodiment, the sets have laser pulses that are preferably from about 25 ps to about 20 ns or 30 ns. These sets of laser pulses can be generated from a CW mode-locked laser system including an optical gate and an optional down stream amplifier, from a step-controlled acousto-optic (A-O) Q-switched laser system, from a laser system employing a beam splitter and an optical delay path, or from two or more synchronized but offset lasers that share a portion of an optical path.

Additional objects and advantages of this invention will be apparent from the following detailed description of preferred embodiments, which proceeds with reference to the accompanying drawings.

BRIEF DESCRIPTION OF THE DRAWINGS

FIG. 2A and FIG. 2$A_1$ are fragmentary cross-sectional side views of a conventional, large semiconductor link structures, respectively with and without an underlying passivation layer, receiving a laser pulse characterized by prior art pulse parameters.

DETAILED DESCRIPTION OF PREFERRED EMBODIMENTS

Figure 1:
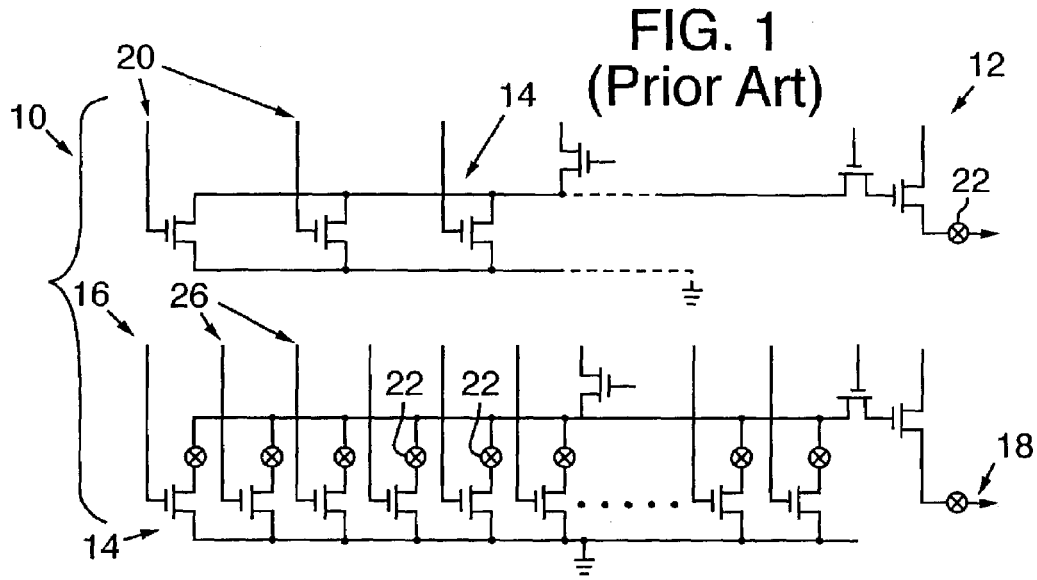
FIG. 1 is a schematic diagram of a portion of a DRAM showing the redundant layout of and programmable links in a spare row of generic circuit cells.
Figure 2A:
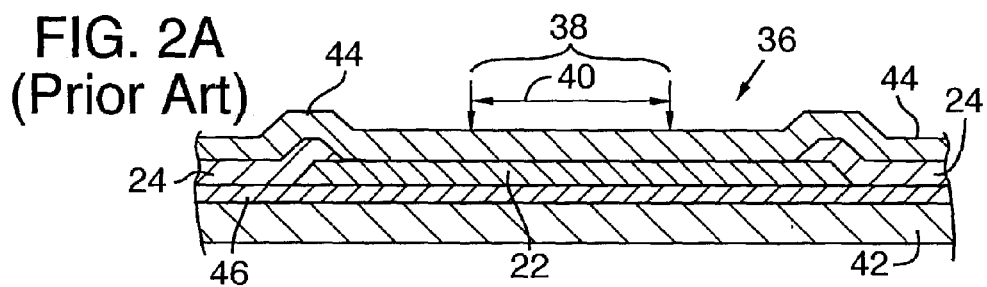
Figure 2B:
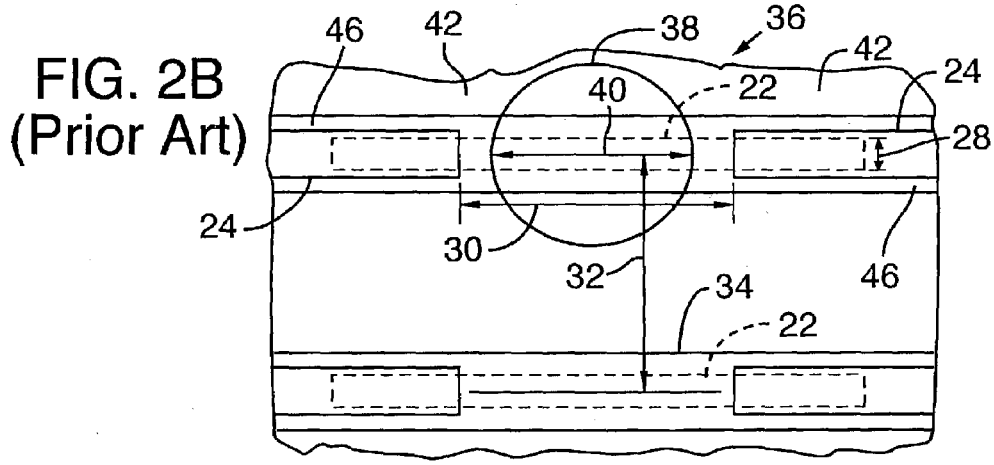
FIG. 2B is a fragmentary top view of the link structure and the laser pulse of FIG. 2A, together with an adjacent circuit structure.
Figure 2C:
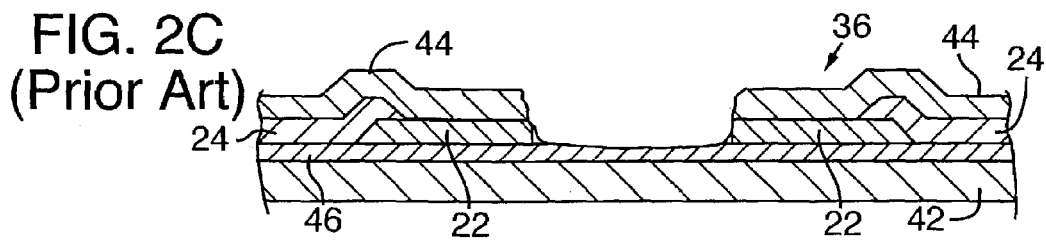
FIG. 2C is a fragmentary cross-sectional side view of the link structure of FIG. 2B after the link is removed by the prior art laser pulse.

FIGS. 3–5, 9, 10B, 12, 14D, and 16C show power versus time graphs of exemplary sets 50a, 50b, 50c, 50d, 50e, 50f, and 50g (generically sets 50) of laser pulses 52a, $52b_1$–$52b_8$, $52c_1$–$52c_5$, $52d_1$–$52d_3$, $52e_1$–$52e_4$, $52f_1$–$52f_2$, and $52g_1$–$52g_2$ (generically laser pulses 52) employed to sever links 22 in accordance with the present invention. Preferably, each set 50 severs a single link 22. Preferred sets 50 include 2 to 50 pulses 52. The duration of each set 50 is preferably shorter than about 1000 ns, more preferably shorter than 500 ns, and most preferably in the range of about 5 ns to 300 ns. Sets 50 are time-displaced by a programmable delay interval that is typically shorter than 0.1 millisecond and may be a function of the speed of the positioning system 62 and the distance between the links 22 to be processed. The pulse width of each laser pulse 52 within set 50 is in the range of about 100 fs to about 30 ns.

During a set 50 of laser pulses 52, each laser pulse 52 has insufficient heat, energy, or peak power to fully sever a link 22 or damage the underlying substrate 42 but removes a part of link 22 and/or any overlying passivation layer 44. At a preferred wavelength from about 150 nm to about 1320 nm, preferred ablation parameters of focused spot size 40 of laser pulses 52 include laser energies of each laser pulse between about 0.005 μJ to about 1 μJ (and intermediate energy ranges between 0.01 μJ to about 0.5 μJ) and laser energies of each set between 0.01 μJ to about 2 μJ and at greater than about 1 Hz, and preferably 1 kHz to 40 kHz or higher. The focused laser spot diameter is preferably 50% to 100% larger than the width of the link 22, depending on the link width 28, link pitch size 32, link material and other link structure and process considerations.

Depending on the wavelength of laser output and the characteristics of the link material, the severing depth of pulses 52 applied to link 22 can be accurately controlled by choosing the energy of each pulse 52 and the number of laser pulses 52 in each set 50 to clean off the bottom of any given link 22, leaving underlying passivation layer 46 relatively intact and substrate 42 undamaged. Hence, the risk of damage to silicon substrate 42 is substantially eliminated, even if a laser wavelength in the UV range is used.

Figure 3:
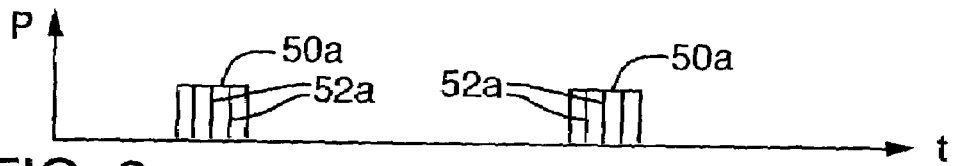
FIG. 3 shows a power versus time graph of exemplary sets of constant amplitude laser pulses employed to sever links in accordance with the present invention.
Figure 8:
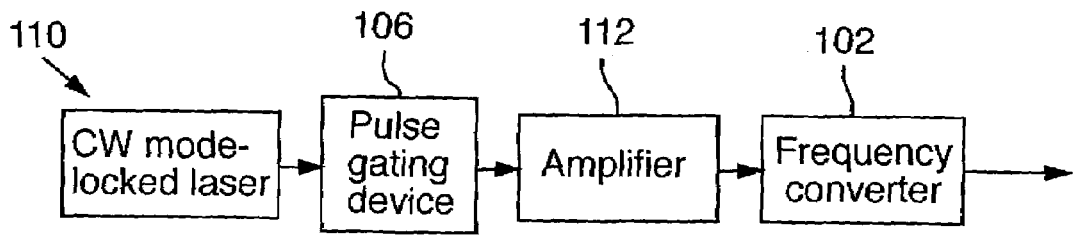
FIG. 8 is a simplified schematic diagram of an alternative embodiment of a laser configuration that can be employed to implement the present invention.

The energy density profile of each set 50 of laser pulses 52 can be controlled better than the energy density profile of a conventional single link-severing laser pulse. With reference to FIG. 3, each laser pulse 52a can be generated with the same energy density to provide a pulse set 50a with a consistent "flat-top" energy density profile. Set 50a can, for example, be accomplished with a mode-locked laser followed by an electro-optic (E-O) or acousto-optic (A-O) optical gate and an optional amplifier (FIG. 8).

Figure 4:
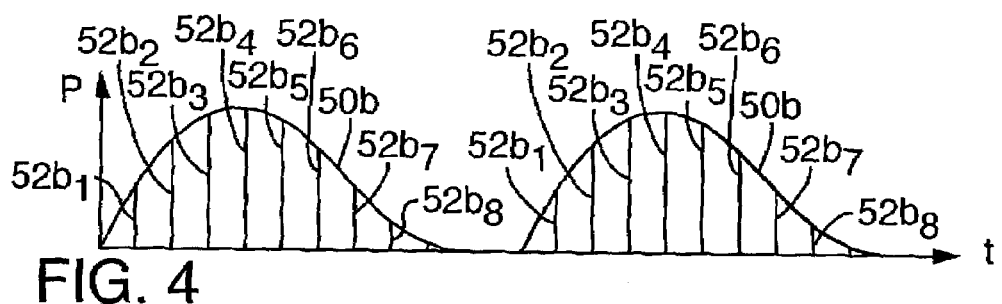
FIG. 4 shows a power versus time graph of alternative exemplary sets of modulated amplitude laser pulses employed to sever links in accordance with the present invention.

With reference to FIG. 4, the energy densities of pulses $52b_1$–$52b_8$ (generically 52b) can be modulated so that sets 50b of pulses 52b can have almost any predetermined shape, such as the energy density profile of a conventional link-blowing laser pulse with a gradual increase and decrease of energy densities over pulses $52b_1$–$52b_8$. Sets 50b can, for example, be accomplished with a simultaneously Q-switched and CW mode-locked laser system 60 shown in FIG. 6. Sequential sets 50 may have different peak power and energy density profiles, particularly if links 22 with different characteristics are being processed.

Figure 5:
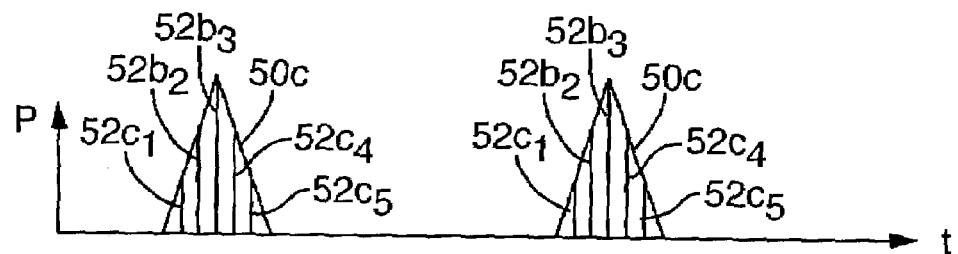
FIG. 5 shows a power versus time graph of other alternative exemplary sets of modulated amplitude laser pulses employed to sever links in accordance with the present invention.

FIG. 5 shows an alternative energy density profile of pulses $52c_1$–$52c_5$ (generically 52c) that have sharply and symmetrically increasing and decreasing over sets 50c. Sets 50c can be accomplished with a simultaneously Q-switched and CW mode-locked laser system 60 shown in FIG. 6.

Another alternative set 50 that is not shown has initial pulses 52 with high energy density and trailing pulses 52 with decreasing energy density. Such an energy density profile for a set 50 would be useful to clean out the bottom of the link without risk of damage to a particularly sensitive work piece.

Figure 6:
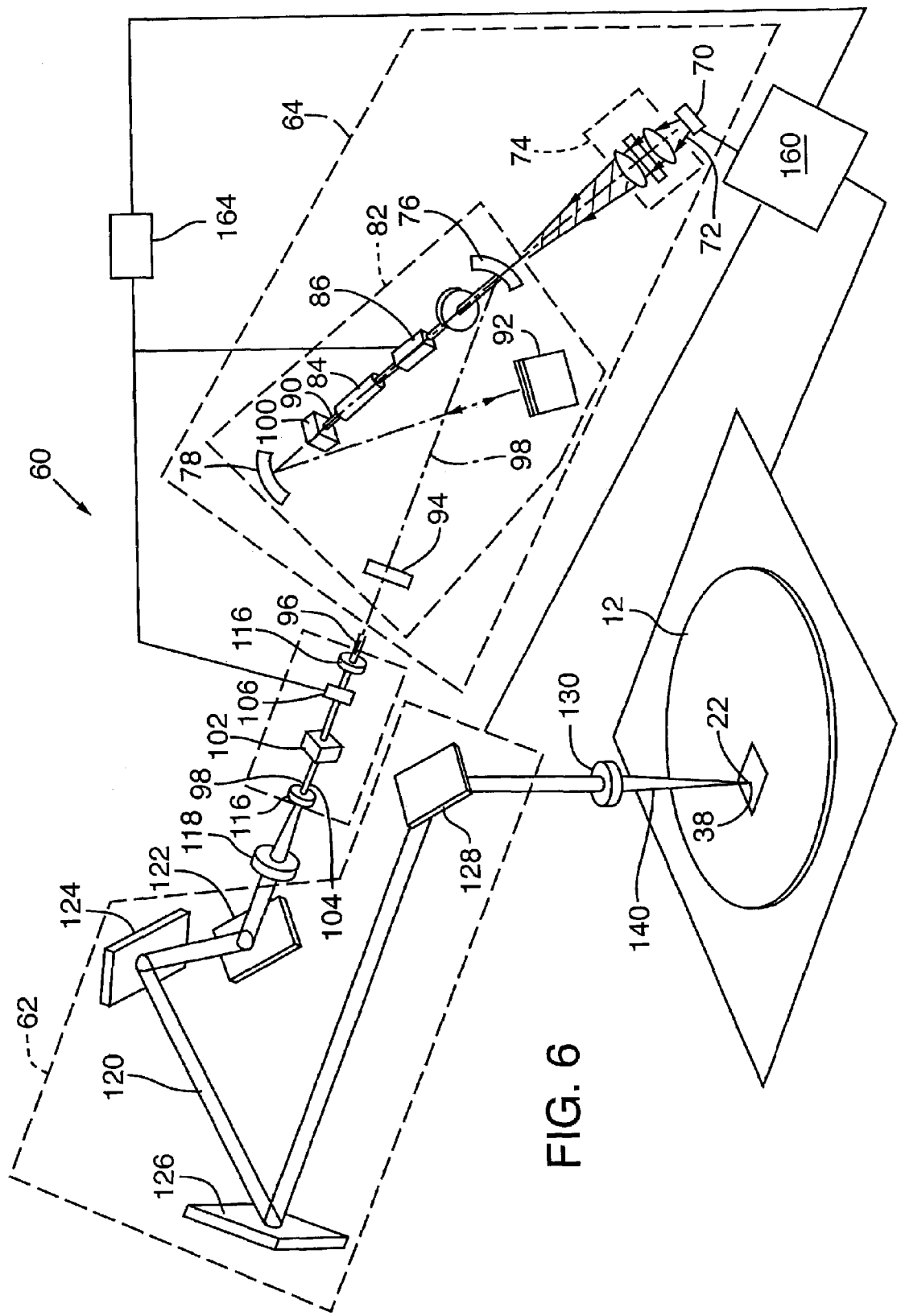
FIGS. 6 and 6A are a partly schematic, simplified diagrams of an embodiment of an exemplary green laser system including a work piece positioner that cooperates with a laser processing control system for practicing the method of the present invention.

FIG. 6 shows a preferred embodiment of a simplified laser system 60 including a Q-switched and/or CW mode-locked laser 64 for generating sets 50 of laser pulses 52 desirable for achieving link severing in accordance with the present invention. Preferred laser wavelengths from about 150 nm to about 2000 nm include, but are not limited to, 1.3, 1.064, or 1.047, 1.03–1.05, 0.75–0.85 μm or their second, third, fourth, or fifth harmonics from Nd:YAG, Nd:YLF, Nd:YVO$_4$, Yb:YAG, or Ti:Sapphire lasers 64. Skilled persons will appreciate that lasers emitting at other suitable wavelengths are commercially available, including fiber lasers, and could be employed.

Laser system 60 is modeled herein only by way of example to a second harmonic (532 nm) Nd:YAG laser 64 since the frequency doubling elements can be removed to eliminate the harmonic conversion. The Nd:YAG or other solid-state laser 64 is preferably pumped by a laser diode 70 or a laser diode-pumped solid-state laser, the emission 72 of which is focused by lens components 74 into laser resonator 82. Laser resonator 82 preferably includes a lasant 84, preferably with a short absorption length, and a Q-switch 86 positioned between focusing/folding mirrors 76 and 78 along an optic axis 90. An aperture 100 may also be positioned between lasant 84 and mirror 78. Mirror 76 reflects light to mirror 78 and to a partly reflective output coupler 94 that propagates laser output 96 along optic axis 98. Mirror 78 is adapted to reflect a portion of the light to a semiconductor saturable absorber mirror device 92 for mode locking the laser 64. A harmonic conversion doubler 102 is preferably placed externally to resonator 82 to convert the laser beam frequency to the second harmonic laser output 104. Skilled persons will appreciate that where harmonic conversion is employed, a gating device 106, such as an E-O or A-O device can be positioned before the harmonic conversion apparatus to gate or finely control the harmonic laser pulse energy.

Skilled persons will appreciate that any of the second, third, or fourth harmonics of Nd:YAG (532 nm, 355 nm, 266 nm); Nd:YLF (524 nm, 349 nm, 262 nm) or the second harmonic of Ti:Sapphire (375–425 nm) can be employed to preferably process certain types of links 22 using appropriate well-known harmonic conversion techniques. Harmonic conversion processes are described in pp. 138–141, V. G. Dmitriev, et. al., "Handbook of Nonlinear Optical Crystals", Springer-Verlag, New York, 1991 ISBN 3-540-53547-0.

An exemplary laser 64 can be a mode-locked Ti-Sapphire ultrashort pulse laser with a laser wavelength in the near IR range, such as 750–850 nm. Spectra Physics makes a Ti-Sapphire ultra fast laser called the MAI TAI™ which provides ultrashort pulses 52 having a pulse width of 100 femtoseconds (fs) at 1 W of power in the 750 to 850 nm range at a repetition rate of 80 MHz. This laser 64 is pumped by a diode-pumped, frequency-doubled, solid-state green YAG laser (5W or 10 W). Other exemplary ultrafast Nd:YAG or Nd:YLF lasers 64 include the JAGUAR-QCW-1000™ and the JAGUAR-CW-250™ sold by Time-Bandwidth® of Zurich, Switzerland.

Figure 7:
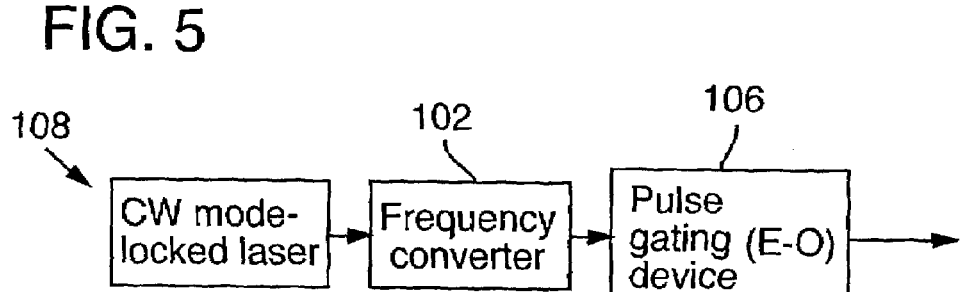
FIG. 7 is a simplified schematic diagram of one laser configuration that can be employed to implement the present invention.

FIG. 7 shows a schematic diagram of a simplified alternative configuration of a laser system 108 for employing the present invention. Skilled persons will appreciate that for harmonically converted green and longer wavelength light, the E-O device 106 is preferably positioned after the harmonic conversion converter 102.

FIG. 8 shows a schematic diagram of another simplified alternative configuration of a laser system 110 for that employs an amplifier 112.

Skilled person will appreciate that a Q-switched laser 64 without CW mode-locking is preferred for severable embodiments, particularly for applications employing pulse withs greater than 0.1 ps. Such laser systems 60 does not employ a saturable absorber and optical paths 90 and 98 are collinear. Such alternative laser systems 60 are commercially available and well known to skilled practitioners.

Laser output 104 (regardless of wavelength or laser type) can be manipulated by a variety of conventional optical components 116 and 118 that are positioned along a beam path 120. Components 116 and 118 may include a beam expander or other laser optical components to collimate laser output 104 to produce a beam with useful propagation characteristics. One or more beam reflecting mirrors 122, 124, 126 and 128 are optionally employed and are highly reflective at the laser wavelength desired, but highly transmissive at the unused wavelengths, so only the desired laser wavelength will reach link structure 36. A focusing lens 130 preferably employs an F1, F2 or F3 single component or multicomponent lens system that focuses the collimated pulsed laser system output 140 to produce a focused spot size 40 that is greater than the link width 38, encompasses it, and is preferably less than 2 µm in diameter or smaller depending on the link width 28 and the laser wavelength.

A preferred beam positioning system 62 is described in detail in U.S. Pat. No. 4,532,402 of Overbeck. Beam positioning system 62 preferably employs a laser controller 160 that controls at least two platforms or stages (stacked or split-axis) and coordinates with reflectors 122, 124, 126, and 128 to target and focus laser system output 140 to a desired laser link 22 on IC device or work piece 12. Beam positioning system 62 permits quick movement between links 22 on work piece 12 to effect unique link-severing operations on-the-fly based on provided test or design data.

The position data preferably direct the focused laser spot 38 over work piece 12 to target link structure 36 with one set 50 of laser pulses 52 of laser system output 140 to remove link 22. The laser system 60 preferably severs each link 22 on-the-fly with a single set 50 of laser pulses 52 without stopping the beam positioning system 62 over any link 22, so high throughput is maintained. Because the sets 50 are less than about 1,000 ns, each set 50 is treated like a single pulse by positioning system 62, depending on the scanning speed of the positioning system 62. For example, if a positioning system 62 has a high speed of about 200 mm per second, then a typical displacement between two consecutive laser spots 38 with interval time of 1,000 ns between them would be typically less than 0.2 µm and preferably less then 0.06 µm during a preferred time interval of set 50, so two or more consecutive spots 38 would substantially overlap and each of the spots 38 would completely cover the link width 28. In addition to control of the repetition rate, the time offset between the initiation of pulses 52 within a set 50 is typically less than 1,000 ns and preferably between about 5 ns and 500 ns and can also be programmable by controlling Q-switch stepping, laser synchronization, or optical path delay techniques as later described.

Laser controller 160 is provided with instructions concerning the desired energy and pulse width of laser pulses 52, the number of pulses 52, and/or the shape and duration of sets 50 according to the characteristics of link structures 36. Laser controller 160 may be influenced by timing data that synchronizes the firing of laser system 60 to the motion of the platforms such as described in U.S. Pat. No. 5,453,594 of Konecny for Radiation Beam Position and Emission Coordination System. Alternatively, skilled persons will appreciate that laser controller 160 may be used for extracavity modulation of laser energy via an E-O or an A-O device 106 and/or may optionally instruct one or more subcontrollers 164 that control Q-switch 86 or gating device 106. Beam positioning system 62 may alternatively or additionally employ the improvements or beam positioners described in U.S. Pat. No. 5,751,585 of Cutler et al. or U.S. Pat. No. 6,430,465 B2 of Cutler, which are assigned to the assignee of this application. Other fixed head, fast positioner head such as galvanometer, piezoelectrically, or voice coil-controlled mirrors, or linear motor driven conventional positioning systems or those employed in the 9300 or 9000 model series manufactured by Electro Scientific Industries, Inc. (ESI) of Portland, Oreg. could also be employed.

With reference again to FIGS. 3-5, in some embodiments, each set 50 of laser pulses 52 is preferably a burst of ultrashort laser pulses 52, which are generally shorter than 25 ps, preferably shorter than or equal to 10 ps, and most preferably from about 10 ps to 100 fs or shorter. The laser pulse widths are preferably shorter than 10 ps because material processing with such laser pulses 52 is believed to be a nonthermal process unlike material processing with laser pulses of longer pulse widths.

During a set 50 of ultrashort laser pulses 52, each laser pulse 52 pits off a small part or sublayer of the passivation layer 44 and/or link material needed to be removed without generating significant heat in link structure 36 or IC device 12. Due to its extremely short pulse width, each pulse exhibits high laser energy intensity that causes dielectric breakdown in conventionally transparent passivation materials. Each laser pulse breaks off a thin sublayer of, for example, about 1,000-2,000 Å of overlying passivation layer 44 until overlying passivation layer 44 is removed. Consecutive ultrashort laser pulses 52 ablate metallic link 22 in a similar layer by layer manner. For conventionally opaque material, each ultrashort pulse 52 ablates a sublayer having a thickness comparable to the absorption depth of the material at the wavelength used. The absorption or ablation depth per single ultrashort laser pulse for most metals is about 100-300 Å.

Although in many circumstances a wide range of energies per ultrashort laser pulse 52 will yield substantially similar severing depths, in a preferred embodiment, each ultrashort laser pulse 52 ablates about a 0.02-0.2 µm depth of material within spot size 40. When ultrashort pulses are employed, preferred sets 50 include 2 to 20 ultrashort pulses 52.

In addition to the "nonthermal" and well-controllable nature of ultrashort laser processing, some common ultrashort laser sources are at wavelengths of around 800 nm and facilitate delivery of a small-sized laser spot. Skilled persons will appreciate, however, that the substantially nonthermal nature of material interaction with ultrashort pulses 52 permits IR laser output be used on links 22 that are narrower without producing an irregular unacceptable explosion pattern. Skilled persons will also appreciate that due to the ultrashort laser pulse width and the higher laser intensity, a higher laser frequency conversion efficiency can be readily achieved and employed.

With reference FIGS. 9–16, in some embodiments, each set 50 preferably includes 2 to 10 pulses 52, which are preferably in the range of about 0.1 ps to about 30 ns and more preferably from about 25 ps to 30 ns or ranges in between such as from about 100 ps to 10 ns or from 5 ns to 20 ns. These typically smaller sets 50 of laser pulses 52 may be generated by additional methods and laser system configurations. For example, with reference to FIG. 9, the energy densities of pulses 52$d$ of set 50$d$ can accomplished with a simultaneously Q-switched and CW mode-locked laser system 60 (FIG. 6).

Figure 6A:
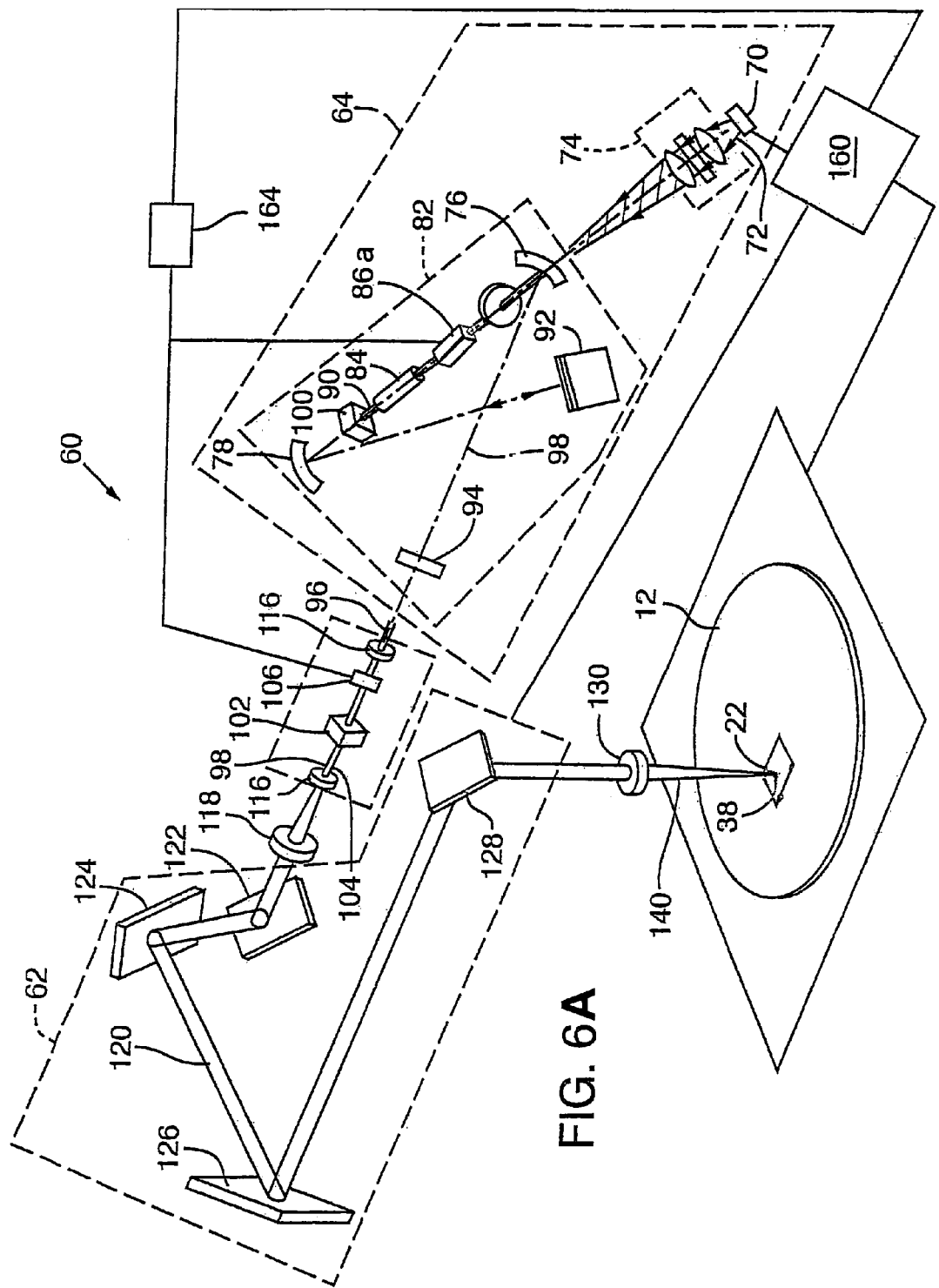
Figure 9:
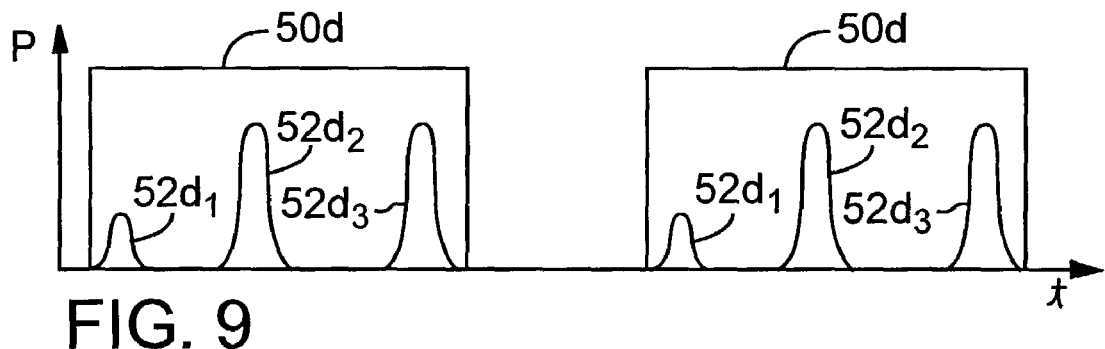
FIG. 9 shows a power versus time graph of alternative exemplary sets of modulated amplitude laser pulses employed to sever links in accordance with the present invention.
Figure 10A:
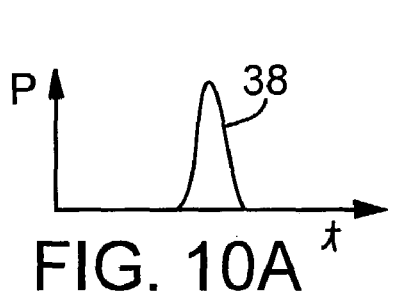
FIG. 10A shows a power versus time graph of a typical single laser pulse emitted by a conventional laser system to sever a link.
Figure 10B:
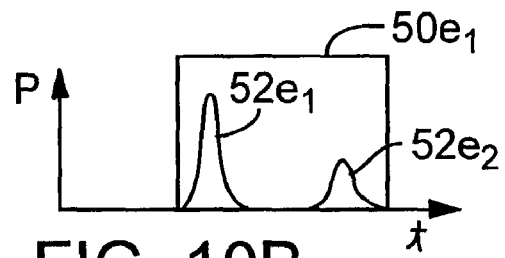
FIG. 10B shows a power versus time graph of an exemplary set of laser pulses emitted by a laser system with a step-controlled Q-switch to sever a link.

FIG. 10A depicts an energy density profile of typical laser output from a conventional laser used for link blowing. FIG. 10B depicts an energy density profile of a set 50$c$ of laser pulses 52$e_1$ and 52$e_2$ emitted from a laser system 60 (with or without mode-locking) that has a step-controlled Q-switch 86. Skilled persons will appreciate that the Q-switch 86$a$ (FIG. 6A) can alternatively be intentionally misaligned for generating more than one laser pulse 52. Set 50$e$ depicts one of a variety of different energy density profiles that can be employed advantageously to sever links 22 of link structures 36 having different types and thicknesses of link or passivation materials. The shape of set 50$c$ can alternatively be accomplished by programming the voltage to an E-O or A-O gating device or by employing and changing the rotation of a polarizer.

Figure 11:
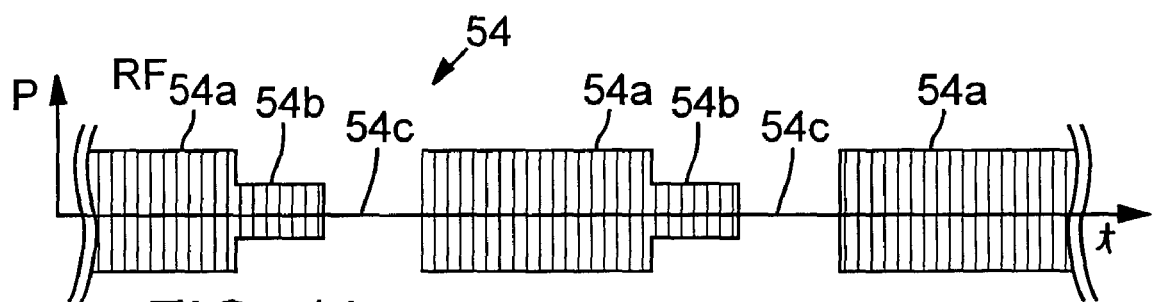
FIG. 11 is a power versus time graph of an exemplary RF signal applied to a step-controlled Q-switch.

FIG. 11 is a power versus time graph of an exemplary RF signal 54 applied to a step-controlled Q-switch 86. Unlike typical laser Q-switching which employs an all or nothing RF signal and results in a single laser pulse (typically elimination of the RF signal allows the pulse to be generated) to process a link 22, step-controlled Q-switching employs one or more intermediate amounts of RF signal 54 to generate one or more quickly sequential pulses 52$e_3$ and 52$e_4$, such as shown in FIG. 12, which is a power versus time graph.

Figure 12:
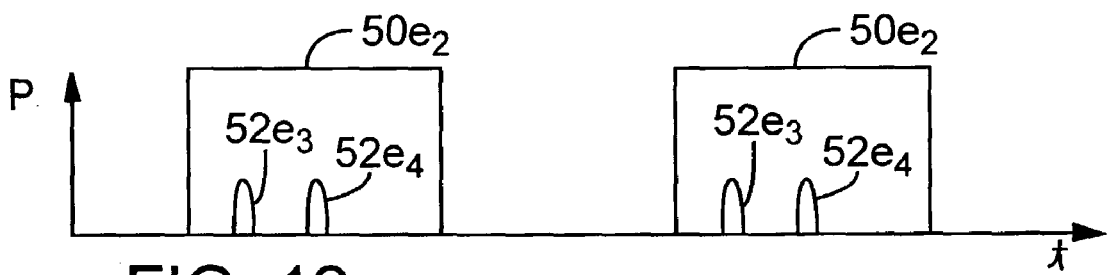
FIG. 12 is a power versus time graph of exemplary laser pulses that can be generated through a step-controlled Q-switch employing the RF signal shown in FIG. 11.

With reference to FIGS. 11 and 12, RF level 54$a$ is sufficient to prevent generation of a laser pulse 52$e$. The RF signal 54 is reduced to an intermediate RF level 54$b$ that permits generation of laser pulse 52$e_3$, and then the RF signal 54 is eliminated to RF level 54$c$ to permit generation of laser pulse 52$e_4$. The step-control Q-switching technique causes the laser pulse 52$e_3$ to have a peak-instantaneous power that is lower than that of a given single unstepped Q-switched laser pulse and allows generation of additional laser pulse(s) 52$e_4$ of peak-instantaneous powers that are also lower than that of the given single unstepped Q-switched laser pulse. The amount and duration of RF signal 54 at RF level 54$b$ can be used to control the peak-instantaneous powers of pulses 52$e_3$ and 52$e_4$ as well as the time offset between the laser pulses 52 in each set 50. More that two laser pulses 52$e$ can be generated in each set 50$e$, and the laser pulses 52$e$ may have equal or unequal amplitudes within or between sets 50$e$ by adjusting the number of steps and duration of the RF signal 54.

Figure 13:
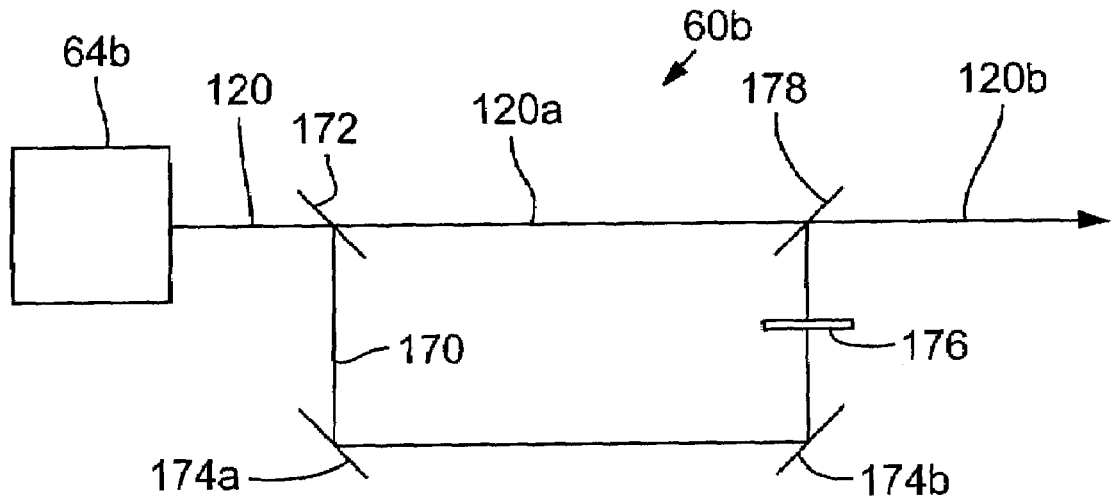
FIG. 13 is a simplified schematic diagram of an alternative embodiment of a laser system that can be employed to implement the present invention.

FIG. 13 is a simplified schematic diagram of an alternative embodiment of a laser system 60$b$ employing a Q-switched laser 64$b$ (with or without CW-mode-locking) and having an optical delay path 170 that diverges from beam path 120, for example. Optical delay path 170 preferably employs a beam splitter 172 positioned along beam path 120. Beam splitter 172 diverts a portion of the laser light from beam path 120 and causes a portion of the light to propagate along beam path 120$a$ and a portion of the light to propagate along optical delay path 170 to reflective mirrors 174$a$ and 174$b$, through an optional half wave plate 176 and then to combiner 178. Combiner 178 is positioned along beam path 120 downstream of beam splitter 172 and recombines the optical delay path 170 with the beam path 120$a$ into a single beam path 120$b$. Skilled persons will appreciate that optical delay path 170 can be positioned at a variety of other locations between laser 64$b$ and link structure 36, such as between output coupling mirror 78 and optical component 116 and may include numerous mirrors 174 spaced by various distances.

Figure 14A:
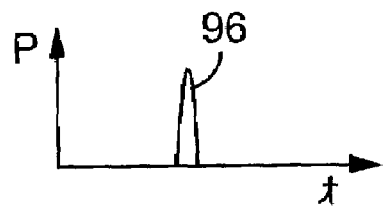
FIGS. 14A–14D show respective power versus time graphs of an exemplary laser pulses propagating along separate optical paths of the laser system shown in FIG. 14.
Figure 14B:
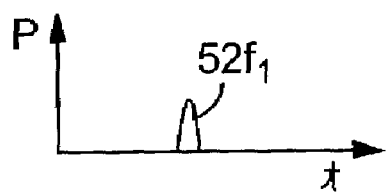
Figure 14C:
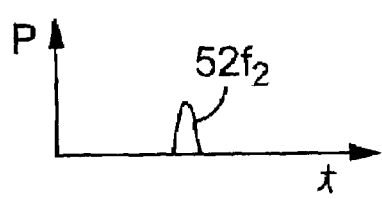
Figure 14D:
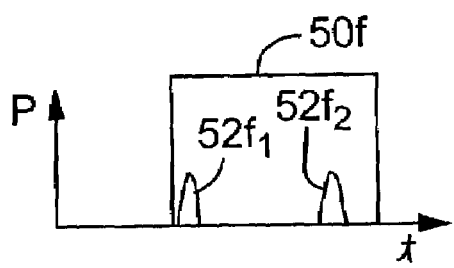

FIGS. 14A–14D show respective power versus time graphs of exemplary laser pulses 52$f$ propagating along optical paths 120, 120$a$, 120$b$, and 170 of the laser system 60$b$ shown in FIG. 13. With reference to FIGS. 13 and 14A–14D, FIG. 14A shows the power versus time graph of a laser output 96 propagating along beam path 120. Beam splitter 172 preferably splits laser output 96 into equal laser pulses 52$f_1$ of FIG. 14B and 52$f_2$ of FIG. 14C (generically laser pulses 52$f$), which respectively propagate along optical path 120$a$ and optical delay path 170. After passing through the optional half wave plate 176, laser pulse 52$f_2$ passes through combiner 178 where it is rejoined with laser pulse 52$f_1$ propagate along optical path 120$b$. FIG. 14D shows the resultant power versus time graph of laser pulses 52$f_1$ and 52$f_2$ propagating along optical path 120$b$. Because optical delay path 170 is longer than beam path 120$a$, laser pulse 52$f_2$ occurs along beam path 120$b$ at a time later than 52$f_1$.

Skilled persons will appreciate that the relative power of pulses 52 can be adjusted with respect to each other by adjusting the amounts of reflection and/or transmission permitted by beam splitter 172. Such adjustments would permit modulated profiles such as those discussed or presented in profiles 50$c$. Skilled persons will also appreciate that the length of optical delay path 170 can be adjusted to control the timing of respective pulses 52$f$. Furthermore, additional delay paths of different lengths and/or of dependent nature could be employed to introduce additional pulses at a variety of time intervals and powers.

Skilled persons will appreciate that one or more optical attenuators can be positioned along common portions of the optical path or along one or both distinct portions of the optical path to further control the peak-instantaneous power of the laser output pulses. Similarly, additional polarization devices can be positioned as desired along one or more of the optical paths. In addition, different optical paths can be used to generate pulses 52 of different spot sizes within a set 50.

Figure 15:
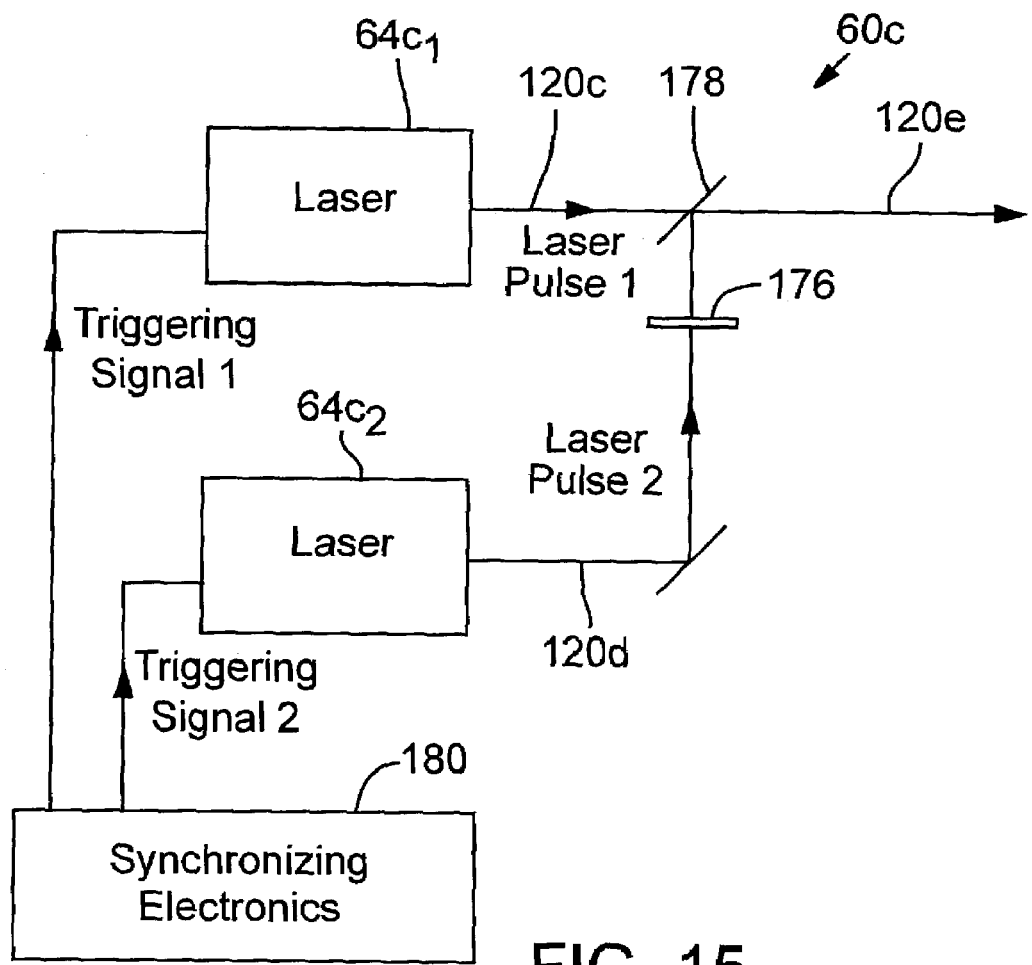
FIG. 15 is a simplified schematic diagram of an alternative embodiment of a laser system that employs two or more lasers to implement the present invention.
Figure 16A:
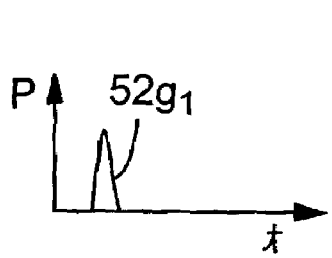
FIGS. 16A–16C show respective power versus time graphs of exemplary laser pulses propagating along separate optical paths of the laser system shown in FIG. 16.
Figure 16B:
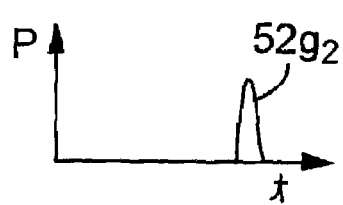
Figure 16C:
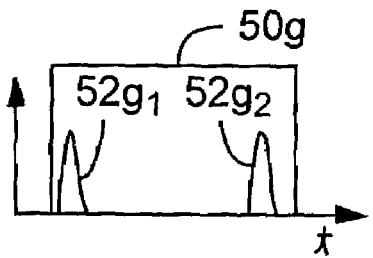

FIG. 15 is a simplified schematic diagram of an alternative embodiment of a laser system 60$c$ that employs two or more lasers 64$c_1$, and 64$c_2$ (generally lasers 64) to implement the present invention, and FIGS. 16A–16C show respective power versus time graphs of an exemplary laser pulses 52$g_1$ and 52$g_2$ (generically 52$g$) propagating along optical paths 120$c$, 120$d$, and 12 laser system 60$c$ shown in FIG. 15. With reference to FIGS. 15 and 16A–16C, lasers 64 are preferably Q-switched (preferably not CW mode-locked) lasers of types previously discussed or well-known variations and can be of the same type or different types. Skilled persons will appreciate that lasers 64 are preferably the same type and their parameters are preferably controlled to produce similar spot sizes, pulse energies, and peak powers. Lasers 64 can be triggered by synchronizing electronics 180 such that the laser outputs are separated by a desired or programmable time interval. A preferred time interval includes about 5 ns to about 1,000 ns.

Laser 64$c_1$ emits laser pulse 52$g_1$ that propagates along optical path 120$c$ and then passes through a combiner 178, and laser 64$c_2$ emits laser pulse 52$g_2$ that propagates along optical path 120$d$ and then passes through an optional half wave plate 176 and the combiner 178, such that both laser pulses 52$g_1$ and 52$g_2$ propagate along optical path 120$e$ but are temporally separated to produce a set 50$g$ of laser pulses 52$g$ having a power versus time profile shown in FIG. 16C.

With respect to all the embodiments, preferably each set 50 severs a single link 22. In most applications, the energy density profile of each set 50 is identical. However, when a work piece 12 includes different types (different materials or different dimensions) of links 22, then a variety of energy density profiles (heights and lengths and as well as the shapes) can be applied as the positioning system 62 scans over the work piece 12.

In view of the foregoing, link processing with sets 50 of laser pulses 52 offers a wider processing window and a superior quality of severed links than does conventional link processing without sacrificing throughput. The versatility of pulses 52 in sets 50 permits better tailoring to particular link characteristics.

Because each laser pulse 52 in the laser pulse set 50 has less laser energy, there is less risk of damaging the neighboring passivation and the silicon substrate 42. In addition to conventional link blowing IR laser wavelengths, laser wavelengths shorter than the IR can also be used for the process with the added advantage of smaller laser beam spot size, even though the silicon wafer's absorption at the shorter laser wavelengths is higher than at the conventional IR wavelengths. Thus, the processing of narrower and denser links is facilitated. This better link removal resolution permits links 22 to be positioned closer together, increasing circuit density. Although link structures 36 can have conventional sizes, the link width 28 can, for example, be less than or equal to about 0.5 µm.

Similarly, passivation layers 44 above or below the links 22 can be made with material other than the traditional SiO2 and SiN, such as the low k material, or can be modified if desirable to be other than a typical height since the sets 50 of pulses 52 can be tailored and since there is less damage risk to the passivation structure. In addition, center-to-center pitch 32 between links 22 processed with sets 50 of laser pulses 52 can be substantially smaller than the pitch 32 between links 22 blown by a conventional IR laser beam-severing pulse. Link 22 can, for example, be within a distance of 2.0 µm or less from other links 22 or adjacent circuit structures 34.

It will be obvious to those having skill in the art that many changes may be made to the details of the above-described embodiment of this invention without departing from the underlying principles thereof. The scope of the present invention should, therefore, be determined only by the following claims.

The invention claimed is:

1. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation to a laser spot position, each of the laser output pulses in the set characterized by a laser spot having a spot size and energy characteristics at the laser spot position, the spot size being larger than the link width and the energy characteristics being below the respective laser damage thresholds of any underlying passivation layer and the substrate; and imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width and so that the sets have specified durations of less than 500 ns and sever the selected electrically conductive links between their associated pairs of electrically conductive contacts without causing operational damage to the substrate.

2. The method of claim 1 in which each set of laser output pulses has a duration of shorter than 200 nanoseconds.

3. The method of claim 2 in which each of the laser output pulses has a pulse width shorter than 25 picoseconds.

4. The method of claim 2 in which each of the laser output pulses has a pulse width of shorter than 10 picoseconds.

5. The method of claim 1 in which each of the laser output pulses has a pulse width shorter than 25 picoseconds.

6. The method of claim 1 in which each of the laser output pulses has a pulse width of shorter than 10 picoseconds.

7. The method of claim 6 in which each of the laser output pulses has a pulse width of shorter than 1 picosecond.

8. The method of claim 1 in which a time offset between initiation of at least two laser output pulses in the set is within about 5 to 1,000 ns.

9. The method of claim 1, in which a delay interval between respective sets is shorter than 0.1 millisecond.

10. The method of claim 1, in which at least two sets of laser output pulses are generated to sever respective links at a programmable repetition rate higher than 10 KHz.

11. The method of claim 1 in which a delay interval between respective sets is programmable.

12. The method of claim 1 in which the electrically conductive link is not covered by an overlying passivation layer.

13. The method of claim 1 in which the electrically conductive links are covered by an overlying passivation layer.

14. The method of claim 13 in which the overlying passivation layer is removed by a substantially nonthermal interaction between at least one of the laser output pulses and the overlying passivation layer.

15. The method of claim 13, wherein the electrically conductive link and the overlying passivation layer have a thickness and at least one of the first and second laser output pulses removes a depth material that is less than thickness of the electrically conductive link and the overlying passivation layer.

16. The method of claim 1 in which the link is removed by a substantially nonthermal interaction between at least one of the laser output pulses and the link.

17. The method of claim 1 in which at least one of the electrically conductive links comprises aluminum, chromide, copper, polysilicon, disilicide, gold, nickel, nickel chromide, platinum, polycide, tantalum nitride, titanium, titanium nitride, tungsten, or tungsten silicide.

18. The method of claim 1, further comprising generating harmonically-converted laser output pulses to a wavelength shorter than 850 nm.

19. The method of claim 1 in which the laser output pulses comprise at least one of the following wavelengths: about 262, 266, 349, 375-425, 355, 524, 532, or 750-850 nm.

20. The method of claim 1 in which each of the laser output pulses has a laser energy of about 0.01 microjoule-10 millijoules.

21. The method of claim 1 in which the spot sizes of the laser spots are the same.

22. The method of claim 1 in which at least each of the laser output pulses of the set has approximately the same energy and approximately the same peak power.

23. The method of claim 1 in which at least two of the laser output pulses of the set have different energies and different peak powers, and in which there is no temporal overlap of two consecutive ones of the laser output pulses in each set.

24. The method of claim 1 further comprising generating the laser output pulses from a CW-pumped, mode-locked, solid-state laser at an energy level of 0.005 microjoule to 1 microjoule per laser output pulse.

25. The method of claim 24 in which an optical gate device is employed to gate the set of laser output pulses from a mode-locked laser pulse train.

26. The method of claim 25 in which an amplifier device is employed to amplify the laser output pulses.

27. The method of claim 24 in which each set of laser output pulses has 2 to 50 pulses and in which each of the laser output pulses has a pulse width shorter than 25 picoseconds.

28. The method of claim 27 in which each of the laser output pulses has a pulse width of shorter than 10 picoseconds.

29. The method of claim 1 in which at least first and second sets of laser output pulses are generated to sever respective links and the first and second sets have similar peak power profiles and similar energy density profiles.

30. The method of claim 1 in which at least first and second sets of laser output pulses are generated to sever respective links and the first and second sets have different peak power profiles and different energy density profiles.

31. The method of claim 1 in which the laser output pulses have energy levels of 0.005 microjoule to 1 microjoule per pulse.

32. The method of claim 1, wherein the step of coordinating laser output generation and relative movement includes providing a focusing lens that is in relative movement with respect to the selected conductive link while the laser output pulses are directed to the selected conductive link.

33. The method of claim 32, wherein the set includes a number of laser output pulses that is fewer than or equal to 50 pulses.

34. The method of claim 32, wherein the second laser output pulse starts after the end of the first laser output pulse.

35. The method of claim 1, wherein the step of generating the laser output pulses comprises using harmonic conversion.

36. The method of claim 1, wherein each of the first and second laser output pulses has a single peak pulse shape.

37. The method of claim 1, wherein the electrically conductive link has a thickness and at least one of the first and second laser output pulses removes a depth of link material that is less than the link thickness.

38. The method of claim 1 in which each link has a link height and each laser output pulse of the set is characterized by energy characteristics that provide a severing depth that is insufficient to sever the link height.

39. The method of claim 38 in which the sets are propagated at a repetition rate of greater than 1 kHz.

40. The method of claim 38 in which the sets are propagated at a repetition rate of greater than 20 kHz.

41. The method of claim 38 in which each of the laser output pulses has a pulse width shorter than 25 picoseconds.

42. The method of claim 38, further comprising generating the laser output pulses at a wavelength shorter than or equal to 850 nm.

43. The method of claim 38 in which each of the laser output pulses has a laser energy of about 0.01 microjoule-10 millijoules.

44. The method of claim 38 in which the spot sizes of the laser spots are the same.

45. The method of claim 38 in which the set of laser output pulses is generated by a solid-state, Q-switched laser having a misaligned Q-switch.

46. The method of claim 38 in which at least a first laser output pulse for each set is generated by a first laser and at least a second laser output pulse for each set is generated by a second laser.

47. The method of claim 46 in which the laser output pulses from the first and second lasers propagate along optical paths that share a substantially collinear common portion.

48. The method of claim 46 in which the spot sizes of the laser spots from the laser output pulses of the first and second lasers are the same.

49. The method of claim 38 in which the set comprises a first laser pulse that is split into first and second laser output pulses such that the first laser output pulse propagates along the first optical path and such that the second laser output pulse propagates along a second optical path, the second optical path having a characteristic that causes the second laser output pulse to reach the selected link structure after the first laser output pulse reaches the link structure.

50. The method of claim 49 in which the first and second laser output pulses propagate along optical paths that share a substantially collinear common portion.

51. The method of claim 49 in which the spot sizes of the laser spots from the first and second laser output pulses are the same.

52. A method of severing selected multiple electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation to a laser spot position, each of the laser output pulses in the set having a pulsewidth shorter than 10 ps and being characterized by a laser spot having a spot size and energy characteristics at the laser spot position, the spot size being larger than the link width and the energy characteristics being below the respective laser damage thresholds of any underlying passivation layer and the substrate, and in which the electrically conductive links are covered by an overlying passivation layer;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width, so that the sets have specified durations of less than 500 ns, so that at least one of the laser output pulses in each set removes a 0.01-0.2 micron depth of the overlying passivation layer by direct laser ablation, and so that the sets sever the selected electrically conductive links between their associated pairs of electrically conductive contacts without causing operational damage to the substrate.

53. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation to a laser spot position, each of the laser output pulses in the set characterized by a laser spot having a spot size and energy characteristics at the laser spot position, the spot size being larger than the link width and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width, so that the sets have specified durations of less than 500 ns, so that at least one of the laser output pulses in each set removes a 0.01-0.03 micron depth of the link, and so that the sets sever the selected electrically conductive links between their associated pairs of electrically conductive contacts without causing operational damage to the substrate.

54. A method of selectively severing electrically conductive redundant memory or integrated circuit links having associated link structures, each link having a link width and being positioned between an associated pair of electrically conductive contacts in a circuit fabricated on either a substrate or an optional underlying passivation layer being positioned between the electrically conductive link and the substrate, the substrate and any optional underlying passivation layer as associated with the link structures being characterized by respective laser damage thresholds, comprising:

providing to a beam positioner beam positioning data representing one or more locations of the selected electrically conductive links, the beam positioner in response to the beam positioning data imparting relative movement of a laser spot position to the substrate;

generating, with an A-O, Q-switched, solid-state laser, for each selected link structure a set of two or more time-displaced laser output pulses, each of the laser output pulses in the set characterized by a laser spot having a spot size and energy characteristics at the laser spot position, the spot size being larger than the link width and the energy characteristics being below the respective laser damage thresholds of any underlying passivation layer and the substrate; and coordinating laser output pulse generation and the relative movement imparted by the beam positioner such that the relative movement is substantially continuous while the laser output pulses in the set sequentially strike the selected link structure so that the laser spot of each laser output pulse in the set encompasses the link width and the set severs the electrically conductive link between its associated pair of electrically conductive contacts with reduced risk of causing operational damage to any underlying passivation layer and the substrate, the A-O, Q-switched, solid-state laser having an A-O Q-switch that is step controlled such that an RF signal to the Q-switch is reduced from a high power level to an intermediate level to generate a first laser output pulse of the set, and the RF signal to the Q-switch is reduced from the intermediate RF level to a smaller RF level to generate a second laser output pulse of the set.

55. The method of claim 54 in which each laser output pulse has a pulse width of between about 1 to 30 nanoseconds.

56. The method of claim 54 in which each of the laser output pulses of the set has approximately the same energy and approximately the same peak power.

57. The method of claim 54 in which first and second laser output pulses of the set have different energies and different peak powers.

58. A method of severing electrically conductive redundant memory or integrated circuit links positioned between respective pairs of electrically conductive contacts in a circuit fabricated on a substrate, each link having a link width, comprising:

providing to a beam positioner beam positioning data representing one or more locations of electrically conductive links in the circuit, the beam positioner coordinating relative movement between a laser spot position and the substrate;

reducing an RF signal to a Q-switch from a high RF level to an intermediate RF level to generate from a laser at least one first laser output pulse having a pulse width of between about 25 picoseconds and 30 nanoseconds during a first time interval that is shorter than 1,000 nanoseconds, the first laser output pulse also having a first laser spot with a spot size that is greater than the link width;

directing, in accordance with the beam positioning data, the first laser output pulse so that the first laser spot impinges a first location of a first electrically conductive link between first contacts;

reducing the RF signal to the Q-switch from the intermediate RF level to a smaller RF level to generate at least one second laser output pulse having a pulse width of between about 25 picoseconds and 30 nanoseconds during the first time interval, the second laser output pulse also having a second laser spot with a spot size that is greater than the link width;

directing the second laser output pulse so that the second laser spot impinges the first location of the first electrically conductive link such that the first and second laser spots substantially overlap and the first and second laser output pulses contribute to the removal of the first electrically conductive link;

increasing the RF signal to the Q-switch from the smaller RF level to the high RF level;

reducing the RF signal to the Q-switch from the high RF level to the intermediate RF level to generate from the laser at least one third laser output pulse having a pulse width duration of between about 25 picoseconds and 30 nanoseconds during a second time interval having a set width duration of shorter than 1,000 nanoseconds, the third laser output pulse also having a third laser spot with a spot size that is greater than the link width;

directing, in accordance with the beam positioning data, the third laser output pulse so that the third laser spot impinges a second location of a second electrically conductive link between second contacts;

reducing the RF signal to the Q-switch from the intermediate RF level to the smaller RF level to generate at least one fourth laser output pulse having a pulse width duration of between about 25 picoseconds and 30 nanoseconds during the second time interval, the fourth laser output pulse also having a fourth laser spot with a spot size that is greater than the link width; and directing the fourth laser output pulse so that the fourth laser spot impinges the second location of the second electrically conductive link such that the third and fourth laser spots substantially overlap and the third and fourth laser output pulses contribute to the removal of the second electrically conductive link.

59. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structures a set of two or more time-displaced laser output pulses for emission and propagation to a laser spot position, each of the laser output pulses in the set characterized by a laser spot having a spot size and energy characteristics at the laser spot position, the spot size being larger than the link width, at least two of the laser output pulses of the set having different energies and different peak powers, and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width and so that the sets have specified durations of less than 500 ns and sever the selected electrically conductive links between their associated pairs of electrically conductive contacts without causing operational damage to the substrate.

60. The method of claim 59 in which each of the laser output pulses has a pulse width shorter than 25 picoseconds.

61. The method of claim 59, further comprising generating harmonically-converted laser output pulses to a wavelength shorter than 850 nm.

62. The method of claim 59 in which each set of the laser output pulses has a laser energy of about 0.01 microjoule-10 millijoules.

63. The method of claim 59 in which the spot sizes of the laser spots are the same.

64. The method of claim 59 in which the set of laser output pulses is generated by a solid-state, Q-switched laser having a misaligned Q-switch.

65. The method of claim 59, in which the laser output pulses have an ultraviolet wavelength.

66. The method of claim 59 in which at least a first laser output pulse for each set is generated by a first laser and at least a second laser output pulse for each set is generated by a second laser.

67. The method of claim 66 in which the laser output pulses from the first and second lasers propagate along optical paths that share a substantially collinear common portion.

68. The method of claim 66 in which the spot sized of the laser spots from the laser output pulses of the first and second lasers are the same.

69. The method of claim 66 in which the first and second lasers are diode-pumped, solid-state, Q-switched lasers.

70. The method of claim 59 in which the set comprises a first laser pulse that is split into first and second laser output pulses such that the first laser output pulse propagates along the first optical path and such that the second laser output pulse propagates along a second optical path, the second optical path having a characteristic that causes the second laser output pulse to reach the selected link structure after the first laser output pulse reaches the link structure.

71. The method of claim 70 in which the first and second laser output pulses propagate along optical paths that share a substantially collinear common portion.

72. The method of claim 70 in which the spot sizes of the laser spots from the first and second laser output pulses are the same.

73. The method of claim 59 in which each link has a link height and each laser output pulse of the set is characterized by energy characteristics that provide a severing depth that is insufficient to sever the link height.

74. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

provedng to a beam positioner beam positioning data representing locations of the multiple selected link structures;

generating, for each selected link structure, a set of two to fifty time-displaced laser output pulses for emission and propagation to a laser spot position, each of the laser output pulses in the set characterized by a laser spot having a spot size and energy characteristics at the laser spot position, the spot size being larger than the link width and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width and so that the sets have specified durations of less than 500 ns sever the selected electrically conductive links between their associated pairs of electrically conductive contacts without causing operational damage to the substrate.

75. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation to a laser spot position, in each set there is no temporal overlap of two consecutive ones of the laser output pulses, and each of the laser output pulses in the set characterized by a laser spot having a spot size and energy characteristics at the laser spot position, the spot size being larger than the link width and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width and so that the sets have specified durations of less than 500 ns sever the selected electrically conductive links between their associated pairs of electrically conductive contacts without causing operational damage to the substrate.

76. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation through a focusing lens to a laser spot position, each of the laser output pulses in the set characterized by a laser spot having a spot size and energy characteristics at the laser spot position, the spot size being larger than the link width, at least two of the laser output pulses of the set having different energies and different peak powers, and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width and so that the sets have specified durations of less than 500 ns and sever the selected electrically conductive links between their associated pairs of electrically conductive contacts without causing operational damage to the substrate, wherein the rapid relative movement includes relative movement of the focusing lens with respect to the multiple selected links as they are severed by the laser output pulses within the specified duration.

77. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two to fifty time-displaced laser output pulses for emission and propagation to a laser spot position, each of the laser output pulses in the set being characterized by a laser spot having a spot size and energy characteristics at the laser spot position, the spot size being larger than the link width and the energy characteristics being below the respective laser damage thresholds of any underlying passivation layer and the substrate, and in which the electrically conductive links are covered by an overlying passivation layer;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width, so that the sets have specified durations of less than 500 ns, so that at least one of the laser output pulses removes a 0.01-0.2 micron depth of the overlying passivation layer by direct laser ablation, and so that the sets sever the selected electrically conductive links between their associated pairs of electrically conductive contacts without causing operational damage to the substrate.

78. A method of severing multiple selected electrically conductive redundant memory or integrated circuit links having associated multiple selected link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer associated with the link structures being characterized by respective laser damage thresholds, comprising:

providing to a beam positioner beam positioning data representing locations of the multiple selected link structures;

generating, for each selected link structure, a set of two or more time-displaced laser output pulses for emission and propagation to a laser spot position, each of the laser output pulses in the set characterized by a laser spot having a spot size and energy characteristics at the laser spot position, the spot size being larger than the link width and the energy characteristics being below the respective laser damage thresholds of any underlying passivation layer and the substrate;

imparting, from the beam positioner, rapid relative movement of the laser spot position and the substrate; the beam positioner, in response to the beam positioning data, moving the laser spot position between multiple selected link structures and directing the laser spot position to the multiple selected link structures so that respective sets of laser pulses impinge on respective multiple selected link structures at a repetition rate of greater than about 1 kHz; and coordinating control of laser output pulse generation and control of the rapid relative movement imparted by the beam positioner such that the laser spot position moves with respect to the selected link structures while the laser output pulses in the sets sequentially strike the selected link structures so that laser spots of the laser output pulses in the set overlap each other and encompass the link width, so that at least one of the laser output pulses in each set removes a 0.02-0.2 micron depth of material, and so that the sets have specified durations of less than 500 ns and sever the selected electrically conductive links between their associated pairs of electrically conductive contacts without causing operational damage to the substrate.

\* \* \* \* \*